US009991137B2

(12) United States Patent
Fujii

(10) Patent No.: US 9,991,137 B2
(45) Date of Patent: Jun. 5, 2018

(54) SUBSTRATE TREATMENT METHOD AND SUBSTRATE TREATMENT DEVICE

(71) Applicant: SCREEN Holdings Co., Ltd., Kyoto (JP)

(72) Inventor: Tatsuya Fujii, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days. days.

(21) Appl. No.: 14/912,722

(22) PCT Filed: Aug. 20, 2014

(86) PCT No.: PCT/JP2014/071779
§ 371 (c)(1),
(2) Date: Feb. 18, 2016

(87) PCT Pub. No.: WO2015/025889
PCT Pub. Date: Feb. 26, 2015

(65) Prior Publication Data
US 2016/0204006 A1    Jul. 14, 2016

(30) Foreign Application Priority Data

Aug. 20, 2013    (JP) ................................. 2013-170612

(51) Int. Cl.
*H01L 21/67*    (2006.01)
*H01L 21/02*    (2006.01)
(Continued)

(52) U.S. Cl.
CPC .. *H01L 21/67023* (2013.01); *H01L 21/02057* (2013.01); *H01L 21/30604* (2013.01);
(Continued)

(58) Field of Classification Search
CPC ......... H01L 21/68723; H01L 21/02057; H01L 21/30604; H01L 21/67051; H01L 21/68764
See application file for complete search history.

(56) References Cited

U.S. PATENT DOCUMENTS 4,788,994 A    12/1988  Shinbara ........................ 134/157
7,524,771 B2 *  4/2009  Izumi ......................... B08B 3/02
                                                             134/1
(Continued)

FOREIGN PATENT DOCUMENTS

JP    2001-015470        1/2001
JP    2001-015470 A      1/2001
(Continued)

OTHER PUBLICATIONS

International Preliminary Report on Patentability (Chapter I) with a Notification from International Bureau (Form PCT/IB/326) dated Mar. 3, 2016.
(Continued)

*Primary Examiner* — Duy Vu N Deo
(74) *Attorney, Agent, or Firm* — Ostrolenk Faber LLP

(57) ABSTRACT

This substrate processing method includes: a substrate rotating step of rotating a substrate around a predetermined vertical axis line at a first rotation speed; a liquid-tight step performed along with the substrate rotating step, and where a first opposed surface is opposed at a first distance to a rotated lower surface of the substrate, and at the same time, a processing liquid is discharged from a processing liquid dispense port of a lower surface nozzle opposed to the lower surface of the substrate to cause a space between the lower surface and the first opposed surface to be in a liquid-tight state by the processing liquid; and a liquid-tight state releasing step of releasing the liquid-tight state in the space between the lower surface and the first opposed surface by separating the lower surface and the first opposed surface after the liquid-tight step.

9 Claims, 17 Drawing Sheets

(51) Int. Cl.
H01L 21/306 (2006.01)
H01L 21/687 (2006.01)
(52) U.S. Cl.
CPC .. *H01L 21/67051* (2013.01); *H01L 21/68728* (2013.01); *H01L 21/68764* (2013.01)

(56) References Cited

U.S. PATENT DOCUMENTS

| | | | |
|---|---|---|---|
| 2002/0189638 A1* | 12/2002 | Luscher | B08B 3/04 134/1.3 |
| 2003/0172955 A1 | 9/2003 | Kuroda et al. | 134/2 |
| 2007/0113872 A1* | 5/2007 | Uchida | H01L 21/67051 134/26 |
| 2010/0247761 A1 | 9/2010 | Hashimoto | 427/240 |

FOREIGN PATENT DOCUMENTS

| | | |
|---|---|---|
| JP | 2003-282514 | 10/2003 |
| JP | 2003-282514 A | 10/2003 |
| JP | 2007-165746 | 6/2007 |
| JP | 2007-165746 A | 6/2007 |
| JP | 2010-238781 | 10/2010 |

OTHER PUBLICATIONS

English translation of the International preliminary report on patentability (Chapter I) with Notification from the International Bureau (Form PCT/IB/338) dated Mar. 3, 2016.
International Search Report dated Nov. 11, 2014 in corresponding PCT International Application No. PCT/JP2014/071779.
Written Opinion dated Nov. 11, 2014 in corresponding PCT International Application No. PCT/JP2014/071779.

* cited by examiner

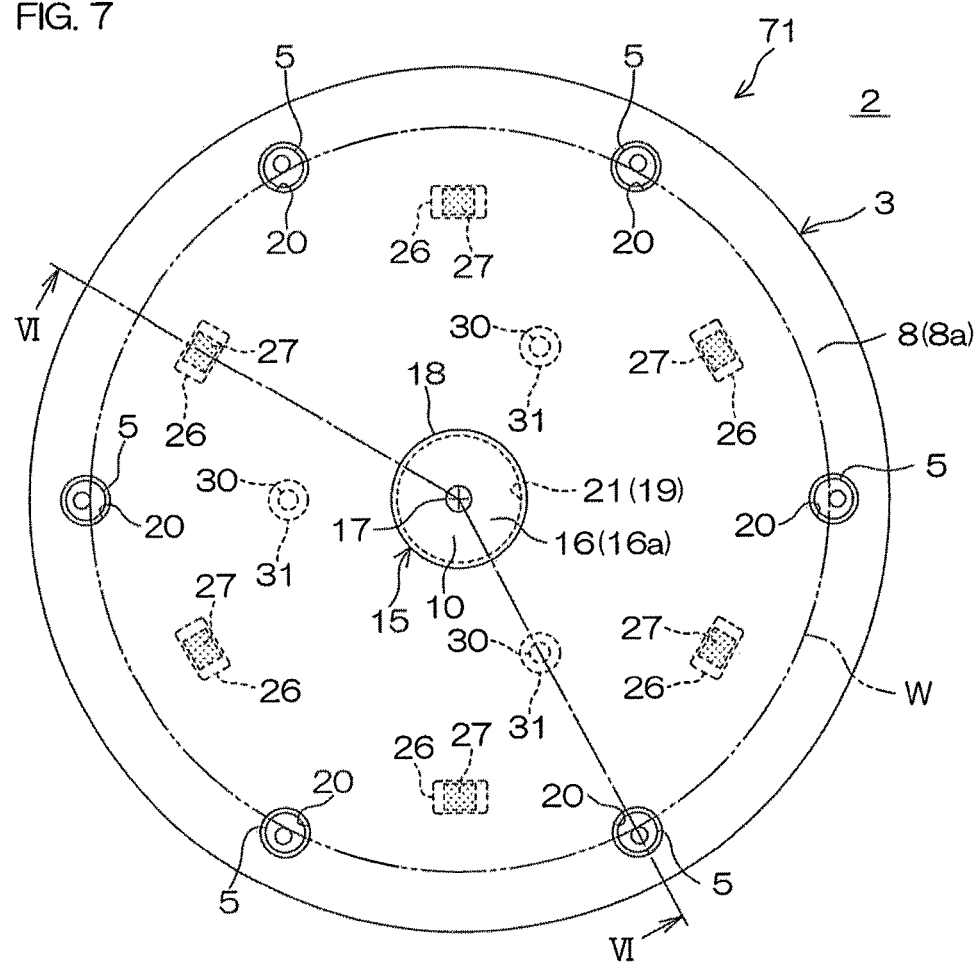

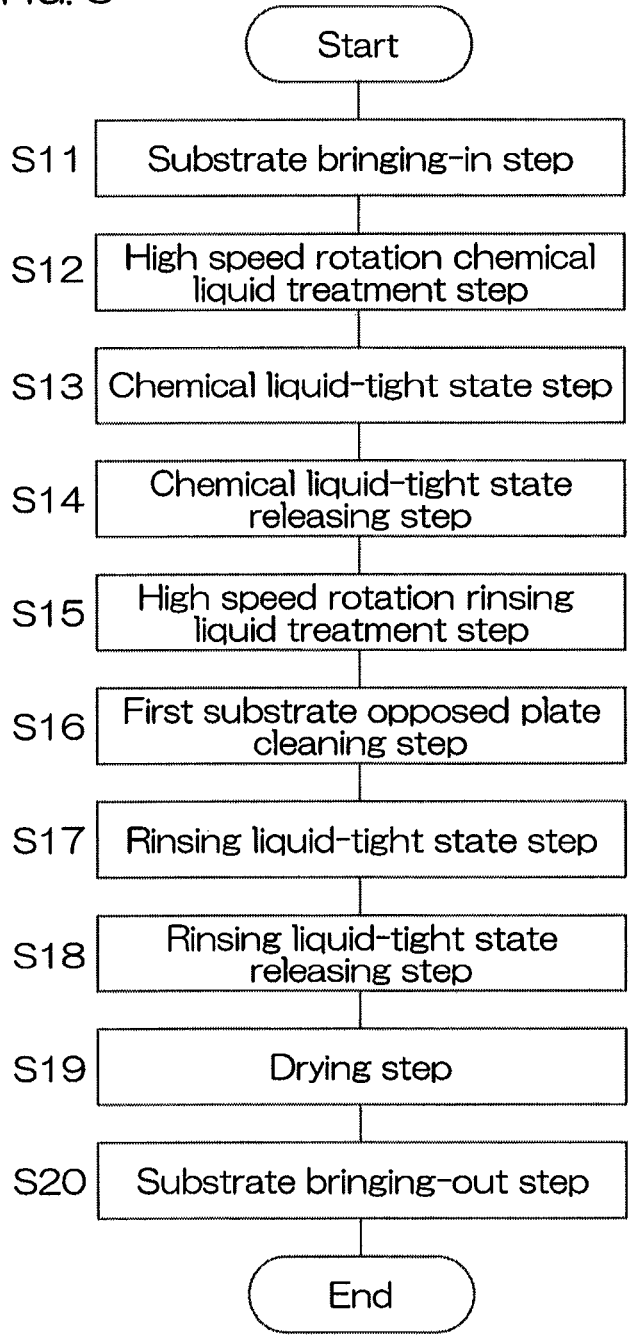

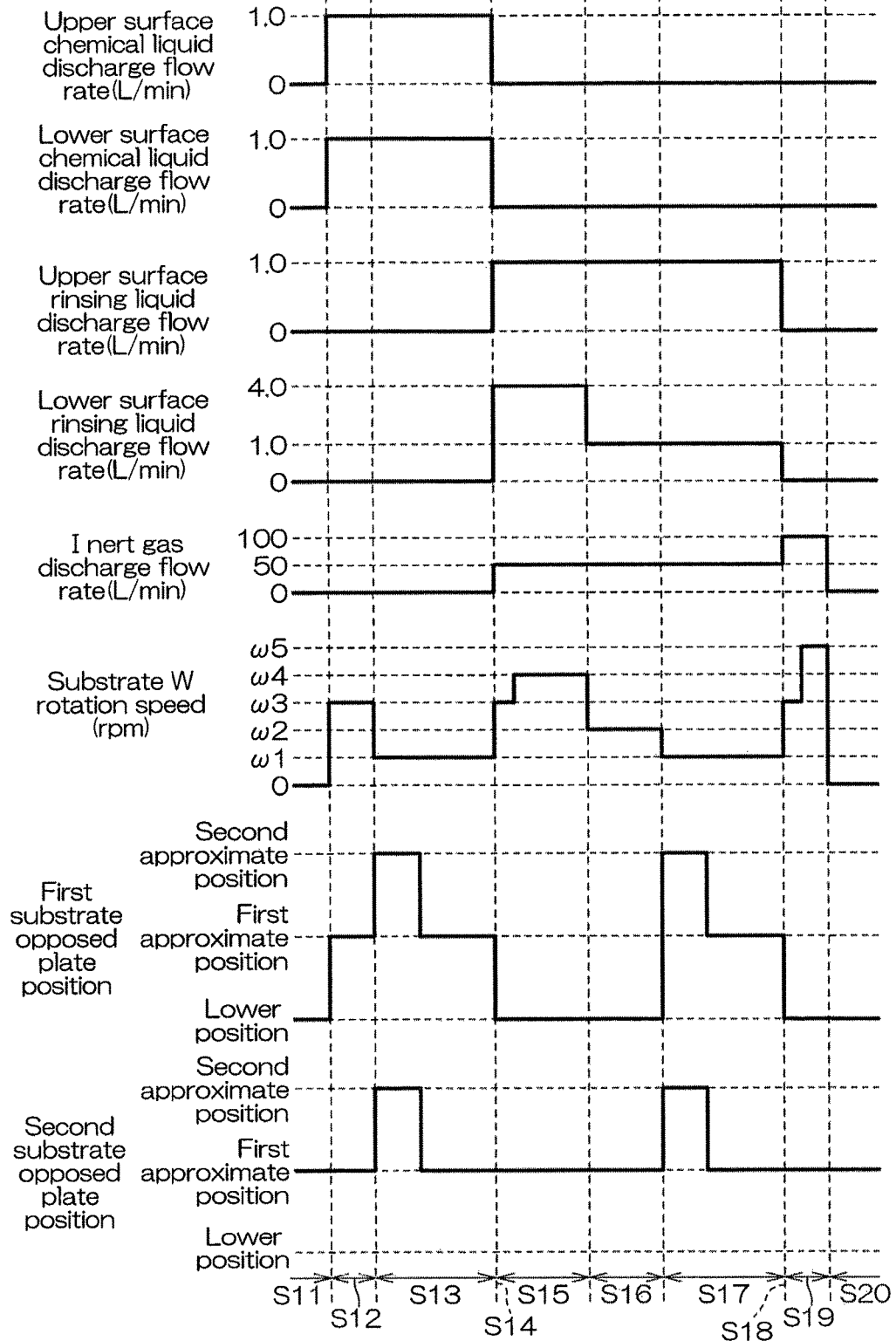

SUBSTRATE TREATMENT METHOD AND SUBSTRATE TREATMENT DEVICE

CROSS-REFERENCE TO RELATED APPLICATIONS

The present application is a 35 U.S.C. § § 371 national phase conversion of PCT/JP2014/071779, filed Aug. 20, 2014, which claims priority to Japanese Patent Application No. 2013-170612, filed Aug. 20, 2013, the contents of both of which are incorporated herein by reference. The PCT International Application was published in the Japanese language.

TECHNICAL FIELD

The present invention relates to a substrate processing method and a substrate processing apparatus for processing a substrate. The substrate to be processed includes, for example, a semiconductor wafer, a substrate for a liquid crystal display, a substrate for a plasma display, a substrate for an FED (Field Emission Display), a substrate for an optical disk, a substrate for a magnetic disk, a substrate for a magneto-optical disk, a substrate for a photomask, a ceramic substrate, and a substrate for a solar cell.

BACKGROUND ART

In a manufacturing process of a semiconductor device or a liquid crystal display, there is used a single-substrate-processing apparatus processing a substrate one by one to perform a processing liquid treatment on a main surface of a substrate such as a semiconductor wafer and a glass substrate for a liquid crystal display panel. A single-substrate-processing apparatus comprises, for example, a spin chuck rotating a substrate while retaining the substrate in a generally horizontal position, and a center axis nozzle supplying a processing liquid to a lower surface of the substrate retained by the spin chuck.

For example, following Patent document 1 discloses a substrate processing apparatus comprising a lower surface processing piping having a lower surface dispense port for supplying a processing liquid to a lower surface of a substrate held by a spin chuck and a disk-shaped opposed plate arranged in an opposed manner to the lower surface of the substrate. In a state where the opposed plate is arranged in an approximate position where the opposed plate approximates the lower surface of the substrate, the processing liquid is dispensed from the lower surface dispense port. As a result, the processing liquid is retained in a liquid-tight state between the lower surface of the substrate and a substrate opposed surface of the opposed plate.

PRIOR ART DOCUMENT

Patent Document

Patent document 1: Japanese Unexamined Patent Publication No. 2010-238781

SUMMARY OF THE INVENTION

Solution to Problem

However, in Patent document 1, a liquid film of the processing liquid is retained on the lower surface of the substrate after a process time to the substrate elapses, and thus, there is a problem that a processing liquid treatment continues on the lower surface of the substrate. That is, since a predetermined time is required to remove a liquid film retained on the lower surface of the substrate, the lower surface of the substrate may be processed beyond a predetermined process amount. As a result, a favorable processing liquid treatment may not be performed on the lower surface of the substrate.

Accordingly, an object of this invention is to provide a substrate processing method and a substrate processing apparatus capable of favorably performing a processing liquid treatment on a lower surface of a substrate while reducing a consumption of the processing liquid.

Solution to Problem

A first aspect of the present invention provides a substrate processing method, including a substrate rotating step of rotating a substrate around a predetermined vertical axis line at a first rotation speed, a liquid-tight step which is performed along with the substrate rotating step, and where a first opposed surface is opposed at a predetermined first distance to a lower surface of the substrate being rotated, and at the same time, a processing liquid is discharged from a processing liquid dispense port of a lower surface nozzle opposed to the lower surface of the substrate to cause a space between the lower surface of the substrate and the first opposed surface to be in a liquid-tight state by the processing liquid; and a liquid-tight state releasing step of releasing the liquid-tight state in the space between the lower surface of the substrate and the first opposed surface by separating the lower surface of the substrate and the first opposed surface after the liquid-tight step.

According to this method, in the liquid-tight step, the processing liquid is supplied between the lower surface of the substrate and the first opposed surface. This causes the space between the lower surface of the substrate and the first opposed surface to be in the liquid-tight state. The liquid-tight state of the space can be achieved by a small flow rate of the processing liquid. As a result, a consumption of the processing liquid can be reduced.

Further, in the liquid-tight state releasing step, the liquid-tight state in the space can be released instantaneously by separating the lower surface of the substrate and the first opposed surface from each other. Thus, the processing liquid does not contact the lower surface of the substrate after the liquid-tight state releasing step, and therefore, progress of a processing liquid treatment on the lower surface of the substrate can be prevented. Thus, the processing liquid treatment can be kept at a predetermined treatment amount. Accordingly, there can be provided the substrate processing method which can favorably perform the processing liquid treatment to the lower surface of the substrate while reducing the consumption of the processing liquid.

According to an embodiment of the present invention, the first opposed surface has a disk shape, and has an outer peripheral end which is positioned outside of a substrate peripheral end on the lower surface of the substrate.

According to this method, since the peripheral end of the first opposed surface is positioned outside of the lower surface peripheral end of the substrate, the liquid-tight state of the processing liquid between the lower surface of the substrate and the first opposed surface can be achieved on the entire lower surface of the substrate. Thus, the processing liquid can contact the entire lower surface of the substrate, and therefore, the lower surface of the substrate can be treated favorably and uniformly by using the processing liquid.

In the liquid-tight step, the first opposed surface and a second opposed surface of the lower surface nozzle having the processing liquid dispense port may be arranged on the same plane.

According to this method, in the liquid-tight step, the second opposed surface of the lower surface nozzle is positioned in an opposed manner to the lower surface of the substrate, and the processing liquid is discharged from the processing liquid dispense port formed on the second opposed surface. As a result, an outwardly cylindrical liquid column of the processing liquid is formed between the second opposed surface of the lower surface nozzle and the lower surface of the substrate. Further, since the first opposed surface and the second opposed surface are arranged on the same plane, the liquid column between the second opposed surface and the lower surface of the substrate spreads along the lower surface of the substrate and the first opposed surface in the space between the lower surface of the substrate and the first opposed surface. Thus, the liquid-tight state of the processing liquid can be relatively easily achieved in the space between the lower surface of the substrate and the first opposed surface.

The liquid-tight step may have a liquid column forming step of forming a liquid column between the first opposed surface and the lower surface of the substrate by discharging the processing liquid from the processing liquid dispense port in a state where the lower surface nozzle is opposed to a vicinity of a center of the lower surface of the substrate, and a liquid column expanding step of expanding the liquid column in a circumferential direction of the substrate by further discharging the processing liquid to the liquid column formed in the liquid column forming step.

The substrate processing method may further include an upper surface treating step of treating an upper surface of the substrate with the processing liquid by supplying the processing liquid to the upper surface of the substrate, and the liquid-tight step may be performed along with the upper surface treating step.

According to this method, since the processing liquid treatment to the upper surface of the substrate and the processing liquid treatment to the lower surface of the substrate are performed at the same time, a treatment time can be decreased compared to a case where the upper and lower surfaces of the substrate are individually subjected to the processing liquid treatment.

Further, when the processing liquid supplied to the upper surface of the substrate is heated to a high temperature, the processing liquid is at the high temperature immediately after being supplied to the upper surface of the substrate. However, its liquid temperature lowers while flowing to the peripheral edge portion of the substrate. Therefore, the temperature of the processing liquid is relatively high in the center portion of the substrate, and the temperature of the processing liquid is relatively low in the peripheral edge portion of the substrate. As a result, uneven treatment rates on the upper surface of the substrate may be caused, for example, in such a manner that the center portion of the upper surface of the substrate is treated by the processing liquid speedily while the peripheral edge portion of the upper surface of the substrate is treated by the processing liquid relatively slowly.

Further, in case the liquid-tight state is formed between the lower surface of the substrate and the first opposed surface, if the processing liquid supplied to the lower surface of the substrate is also heated to a high temperature, the processing liquid of the high temperature can contact a wide range of the lower surface (the entire lower surface) of the substrate. As a result, the substrate can have a high and even temperature distribution. Thus, even when the chemical liquid of the high temperature is supplied to the upper surface of the substrate, it can be prevented that the temperature of the supplied processing liquid lowers at the peripheral edge portion of the substrate. As a result, the upper surface of the substrate can be treated at an even treatment rate.

The substrate processing method may further include a high-speed rotation treatment step which is performed before the liquid-tight step, and where the processing liquid is supplied to the lower surface of the substrate while the substrate is rotated at a second rotation speed higher than the first rotation speed, and performance of the liquid-tight step may be started continuously from a conclusion of the high-speed rotation treatment step.

According to this method, the processing liquid treatment is performed on the lower surface of the substrate in the high-speed rotation treatment step, and then, the processing liquid treatment is performed on the lower surface of the substrate in the liquid-tight step. Therefore, the lower surface of the substrate can be treated more favorably.

A flow rate of the processing liquid supplied to the substrate may be decreased at a timing of a shift from the high-speed rotation treatment step to the liquid-tight step.

According to this method, if the processing liquid at a relatively large flow rate is supplied to the lower surface of the substrate in the high-speed rotation treatment step, a relatively large amount of the processing liquid exists on the lower surface of the substrate at the conclusion of the high-speed rotation treatment step. Further, at a start of the liquid-tight step, the first opposed surface is opposed at the first distance to the lower surface of the substrate, and a rotation speed of the substrate is decelerated from a previous one. In this state, since the relatively large amount of the processing liquid exists on the lower surface of the substrate, the liquid-tight state of the processing liquid is favorably formed in the space between the first opposed surface and the lower surface of the substrate. This makes smooth the shift from the high-speed rotation treatment step to the liquid-tight step.

The substrate processing method may further include a cleaning step which is performed before the liquid-tight step, and where the first opposed surface is opposed to the lower surface of the substrate at a second distance which is larger than the first distance, the substrate is rotated at a third rotation speed which is faster than the first rotation speed and slower than the second rotation speed, and at the same time, a cleaning liquid is supplied from the processing liquid dispense port to the space between the lower surface of the substrate and the first opposed surface to clean the first opposed surface.

According to this method, in the state where the first opposed surface is opposed to the lower surface of the substrate at the second distance, the cleaning liquid is supplied to the lower surface of the substrate while the substrate is rotated at the third rotation speed. The cleaning liquid supplied to the lower surface of the substrate spreads to the peripheral edge portion on the lower surface of the substrate, then falls downwardly by the gravity from the peripheral edge portion, and is supplied to the first opposed surface. Thus, the first opposed surface can be cleaned by the cleaning liquid running along the first opposed surface.

Further, since the cleaning step for cleaning the first opposed surface is performed before the liquid-tight step, the liquid-tight step can be started in a state where the processing liquid is not on the substrate. Therefore, when a type of the processing liquid used in the high-speed rotation treatment step is different from a type of the processing liquid used in the liquid-tight step, the processing liquids of the different types can be prevented from mixing.

The cleaning liquid may include the processing liquid, and the performance of the liquid-tight step may be started continuously from a conclusion of the cleaning step, and the liquid-tight step may decrease the flow rate of the processing liquid supplied to the substrate from previous one in a manner synchronized with a shift from the cleaning step to the liquid-tight step.

According to this method, if the cleaning liquid at a relatively large flow rate is supplied to the lower surface of the substrate in the cleaning step, a relatively large amount of the cleaning liquid exists on the lower surface of the substrate at the conclusion of the cleaning step. In this state, while the flow rate of the cleaning liquid supplied to the substrate is decreased from previous one, the performance of the liquid-tight step is started continuously from a conclusion of the liquid-tight step. In this case, since the relatively large amount of the cleaning liquid exists on the lower surface of the substrate, the liquid-tight state of the cleaning liquid can be favorably formed in the space between the first opposed surface and the lower surface of the substrate. This makes smooth the shift from the cleaning step to the liquid-tight step.

The processing liquid may be an etchant.

When the substrate is treated by using the etchant, a liquid film of the processing liquid can be retained on the lower surface of the substrate even after a predetermined etching process time, and this may cause a problem of progress of an etching process on the lower surface of the substrate.

However, in the substrate processing method, the etchant does not contact the lower surface of the substrate after the liquid-tight state releasing step by separating the lower surface of the substrate and the first opposed surface in the liquid-tight state releasing step. As a result, the progress of the etching process on the lower surface of the substrate can be prevented.

A second aspect of the present invention provides a substrate processing apparatus, including a substrate holding and rotating unit arranged to hold a substrate horizontally and rotating the substrate around a predetermined vertical axis line, a substrate opposed plate having a first opposed surface which is opposed to a lower surface of the substrate to be rotated by the substrate holding and rotating unit; an opposed plate up and down unit arranged to make the substrate opposed plate go up and down; a lower surface nozzle which has a processing liquid dispense port opposed to the lower surface of the substrate and is for supplying a processing liquid to a space between the lower surface of the substrate and the first opposed surface; a processing liquid supplying unit arranged to supply the processing liquid to the lower surface nozzle; a liquid-tight state controlling unit arranged to perform a liquid-tight step where the substrate holding and rotating unit, the opposed plate up and down unit and the processing liquid supplying unit are controlled to rotate the substrate at a predetermined first rotation speed, to make the first opposed surface opposed at a predetermined first distance to the lower surface of the substrate, and to discharge the processing liquid from the processing liquid dispense port, thereby causing the space between the lower surface of the substrate and the first opposed surface to be a liquid-tight state by the processing liquid; and a liquid-tight state releasing controlling unit which controls the opposed plate up and down unit after the performance of the liquid-tight step to separate the lower surface of the substrate and the first opposed surface from a state where the liquid-tight step is performed, thereby releasing the liquid-tight state in the space between the lower surface of the substrate and the first opposed surface.

According to this configuration, in the liquid-tight step, the processing liquid is supplied between the lower surface of the substrate and the first opposed surface. This causes the space between the lower surface of the substrate and the first opposed surface to be in the liquid-tight state. The liquid-tight state of the space can be achieved by a small flow rate of the processing liquid. As a result, a consumption of the processing liquid can be reduced.

Further, in the liquid-tight state releasing step, the liquid-tight state in the space can be released instantaneously by separating the lower surface of the substrate and the first opposed surface from each other. Thus, the processing liquid does not contact the lower surface of the substrate after the liquid-tight state releasing step, and therefore, progress of a processing liquid treatment on the lower surface of the substrate can be prevented. Thus, the processing liquid treatment can be kept at a predetermined treatment amount. Accordingly, there can be provided the substrate processing apparatus which can favorably perform the processing liquid treatment on the lower surface of the substrate while being able to reduce a consumption of the processing liquid.

According to an embodiment of the present invention, the first opposed surface may have a disk shape, and may have an outer peripheral end which is positioned outside of a substrate peripheral end of the lower surface of the substrate, the substrate holding and rotating unit may have a base which is rotatable around the vertical axis line, and a plurality of holding members which are set up on the base and hold the substrate, and the substrate opposed plate may be formed with a plurality of insertion recesses which penetrate in a thickness direction of the substrate opposed plate and through which the holding members are inserted.

According to this configuration, since the outer peripheral end of the first opposed surface is positioned outside of the lower surface peripheral end of the substrate, the liquid-tight state of the processing liquid between the lower surface of the substrate and the first opposed surface can be achieved on the entire lower surface of the substrate. Thus, the processing liquid can contact the entire lower surface of the substrate, and therefore, the lower surface of the substrate can be treated favorably and uniformly by using the processing liquid.

Further, since the substrate opposed plate is formed with the plurality of insertion recesses through which the holding members are inserted, going up and down of the substrate opposed plate is not interfered. Therefore, the liquid-tight state of the processing liquid can be formed smoothly between the lower surface of the substrate and the substrate opposed plate.

Each of the insertion recesses may be an insertion hole. In this case, a peripheral edge portion of the substrate opposed plate overhangs outwardly from each insertion hole, and a thick portion is provided between each insertion hole and the outer peripheral end of the substrate opposed plate. The liquid-tight state with the processing liquid can be reliably achieved on the entire lower surface of the substrate by this thick portion.

Further, the lower surface nozzle may have a second opposed surface which is opposed to the lower surface of the substrate at a distance and has the processing liquid dispense port.

According to this configuration, in the liquid-tight step, the second opposed surface of the lower surface nozzle is positioned in an opposed manner to the lower surface of the substrate, and the processing liquid is discharged from the processing liquid dispense port formed on the second opposed surface. As a result, an outwardly cylindrical liquid column of the processing liquid is formed between the second opposed surface of the lower surface nozzle and the lower surface of the substrate. Further, since the first opposed surface and the second opposed surface are arranged on the same plane, the liquid column between the second opposed surface and the lower surface of the substrate spreads along the lower surface of the substrate and the first opposed surface in the space between the lower surface of the substrate and the first opposed surface. Thus, the liquid-tight state of the processing liquid can be relatively easily achieved in the space between the lower surface of the substrate and the first opposed surface.

The substrate processing apparatus may further include a nozzle up and down mechanism for making the lower surface nozzle go up and down.

According to this configuration, when the lower surface nozzle is raised, a discharging position of the processing liquid can be approximated to the lower surface of the substrate. Thus, achievement of the liquid-tight state in the space between the lower surface of the substrate and the first opposed surface can be facilitated. Further, when the performance of the liquid-tight step is finished, the lower surface nozzle along with the substrate opposed surface can be easily separated from the lower surface of the substrate by using the nozzle up and down mechanism.

The second opposed surface may be opposed to a region including a rotation center of the substrate by the substrate holding and rotating unit, and the first opposed surface may have an annular shape surrounding a periphery of the second opposed surface in plan view.

The first opposed surface may include a hydrophilic surface. In this case, when a surface of the first opposed surface is hydrophilic, the space between the lower surface of the substrate and the first opposed surface can be easily made in the liquid-tight state.

Examples of the first opposed surface including the hydrophilic surface include one where a number of recessed locations are formed on the first opposed surface and one where wettability is improved by using a predetermined surface roughness.

The above-described and other objects, characteristics and effects of the present invention become obvious from the following descriptions of embodiments with reference to accompanying drawings.

BRIEF DESCRIPTION OF THE DRAWINGS

FIG. 7 is a plan view showing the schematic configuration of the substrate processing apparatus of FIG. 6.

FIG. 8 is a flow chart showing a process example of the substrate processing apparatus of FIG. 6.

FIG. 9 is a time chart showing the process example of the substrate processing apparatus of FIG. 6.

DESCRIPTION OF EMBODIMENTS

Figure 1:
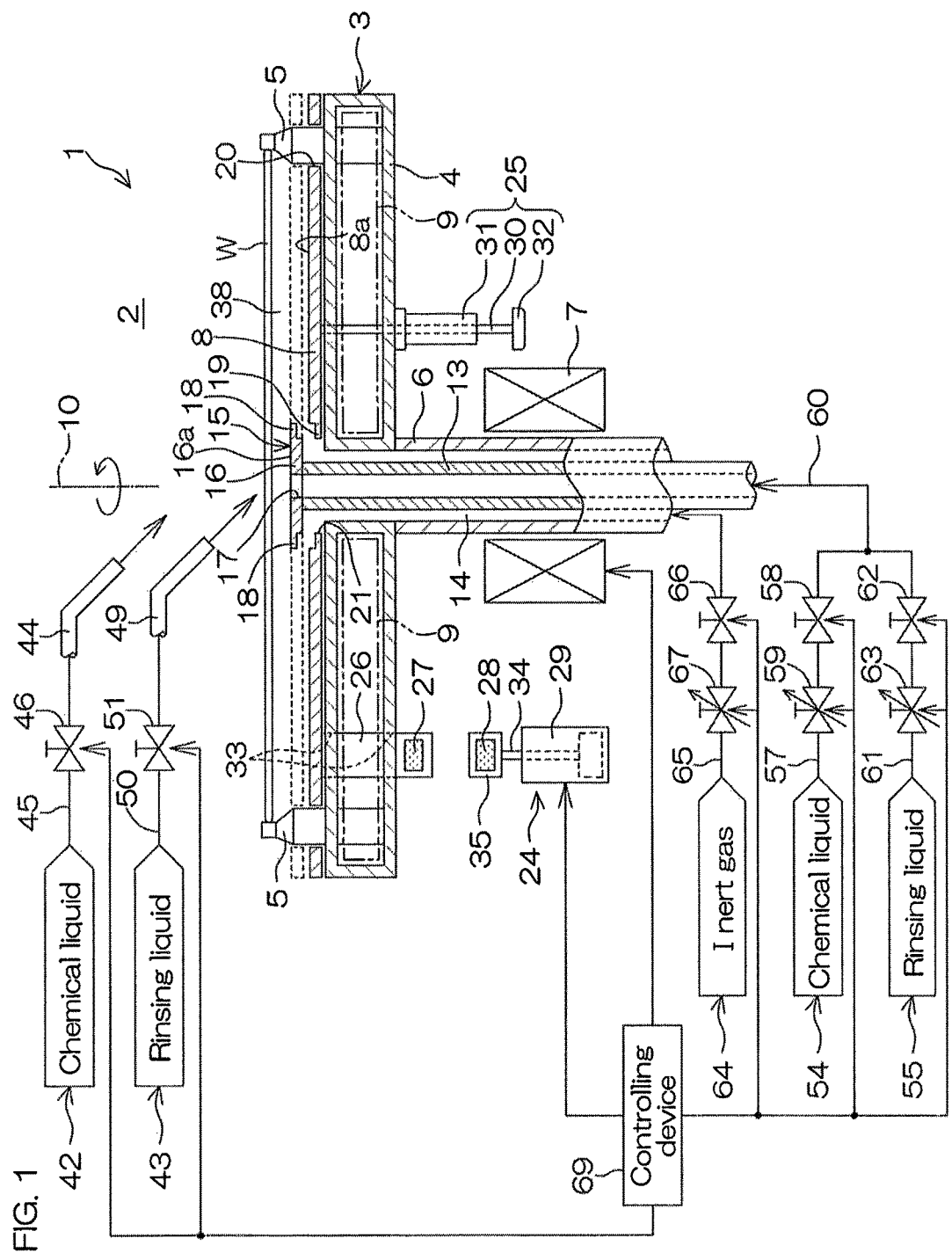
FIG. 1 shows a schematic configuration of a substrate processing apparatus according to a first embodiment of the present invention.
Figure 2:
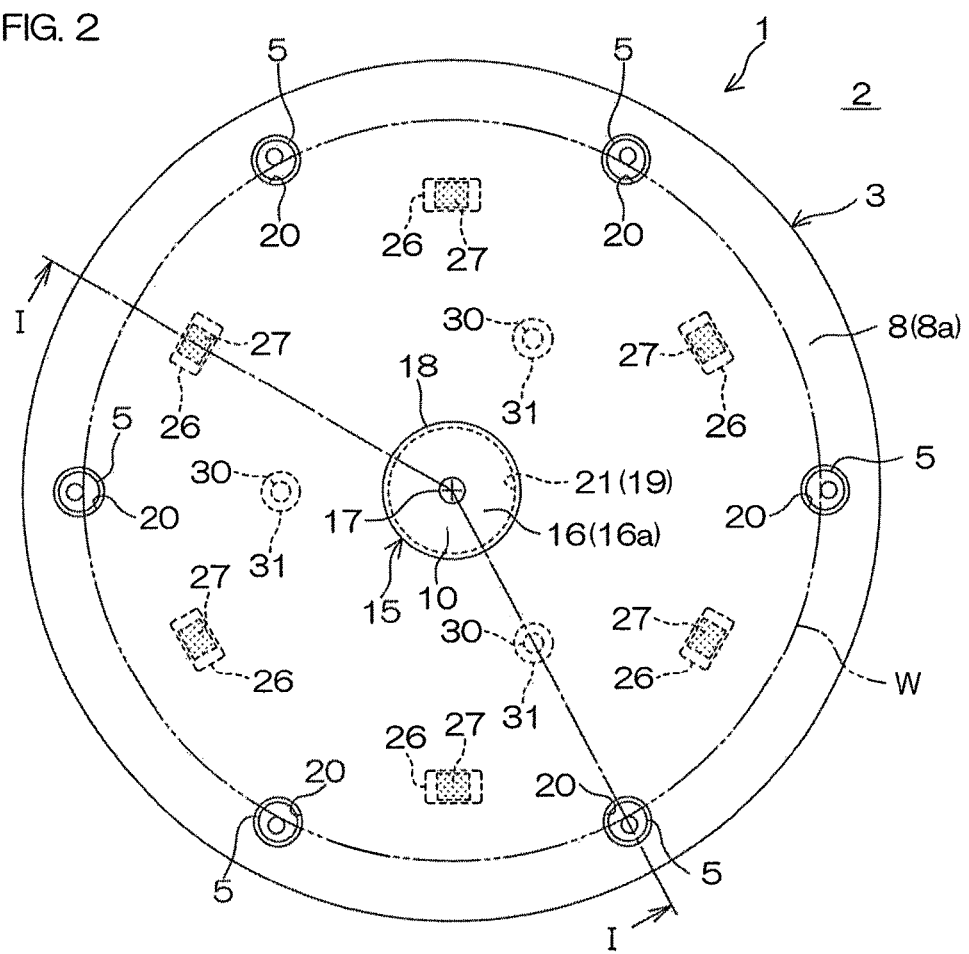
FIG. 2 is a plan view showing the schematic configuration of the substrate processing apparatus of FIG. 1.

FIG. 1 shows a schematic configuration of a substrate processing apparatus 1 according to a first embodiment of the present invention. FIG. 2 is a plan view showing the schematic configuration of the substrate processing apparatus 1 of FIG. 1. FIG. 1 shows a section along a cutting line in FIG. 2 viewed in a direction of an arrow I.

The substrate processing apparatus 1 is a single-substrate-processing apparatus processing a substrate W one by one. A case where a semiconductor substrate is employed as the substrate W is described below as an example. The substrate processing apparatus 1 comprises a processing chamber 2 divided by a partition wall, and a spin chuck (substrate holding and rotating unit) 3 horizontally holding and rotating the substrate W in the processing chamber 2.

The spin chuck 3 comprises a disk-shaped spin base (base) 4 being rotatable around a rotation axis line 10 along a vertical direction, a holding member 5 provided on the spin base 4, a cylindrical rotation shaft 6 extending vertically downwardly from the spin base 4, a spin drive mechanism 7 rotating the spin base 4 and the rotation shaft 6 around the rotation axis line 10, and a first substrate opposed plate 8 arranged between an upper surface of the spin base 4 and a substrate holding height by the holding member 5.

The spin chuck 3 is a clamping-type chuck which horizontally holds the substrate W by a plurality of holding members 5 and holds the substrate W in a horizontal position. The spin drive mechanism 7 employs an electric motor. When a rotary drive force from the spin drive mechanism 7 is input into the rotation shaft 6, the substrate W held by the holding members 5 is rotated unitarily with the spin base 4 around the rotation axis line 10.

As shown in FIG. 2, a plurality of the holding members 5 (for example, 6 members in this embodiment) are provided at intervals in a circumferential direction at a peripheral edge portion of the upper surface of the spin base 4. Each holding member 5 is configured to horizontally hold the substrate W at the substrate holding height which is upwardly spaced at a predetermined interval from the upper surface of the spin base 4. The holding member 5 is attached with a substrate-holding-member movable mechanism 9 which is accommodated in the spin base 4. As a result of this, the holding member 5 is movable with respect to the spin base 4. The substrate-holding-member movable mechanism 9 is, for example, a known link mechanism which moves the holding member 5 according to rotation of the rotation shaft 6.

In the following descriptions, a surface of the substrate W which is opposed to the upper surface of the spin base 4 in a state of being held by the plurality of the holding members 5 is referred to as the lower surface of the substrate W, and a surface opposite to this lower surface is referred to as the upper surface of the substrate W.

The rotation shaft 6 is a cylindrical hollow shaft. A processing liquid supply pipe 13 supplying a processing liquid from a side of the lower surface of the substrate W and an inert gas supply pipe 14 supplying an inert gas from the side of the lower surface of the substrate W are inserted through an inside of the rotation shaft 6. The inert gas supply pipe 14 surrounds an outer periphery of the processing liquid supply pipe 13.

An upper end of the processing liquid supply pipe 13 in a vertical direction protrudes on the upper surface of the spin base 4 via a through hole provided in a center portion of the spin base 4. That is, the upper end of the processing liquid supply pipe 13 in the vertical direction is positioned between the upper surface of the spin base 4 and the lower surface of the substrate W. A lower surface nozzle 15 is coupled to the upper end of the processing liquid supply pipe 13.

The lower surface nozzle 15 comprises a second substrate opposed plate 16 arranged between the upper surface of the spin base 4 and the lower surface of the substrate W. The second substrate opposed plate 16 has a generally disk shape, and has a second substrate opposed surface (second opposed surface) 16a which is opposed to the lower surface of the substrate W. A center portion of the second substrate opposed plate 16 is provided with an opening for exposing the upper end of the processing liquid supply pipe 13. This opening is a processing liquid dispense port 17 discharging the processing liquid on the side of the lower surface of the substrate W. The processing liquid dispense port 17 is opposed to a rotation center of the lower surface of the substrate W arranged on the spin base 4. A peripheral edge portion of the second substrate opposed plate 16 is formed with a flange 18 facing outward.

The first substrate opposed plate 8 is a disk-shaped member having an outer diameter larger than a diameter of the substrate W, and an upper surface thereof has a first substrate opposed surface (first opposed surface) 8a which is opposed to the lower surface of the substrate. That is, an outer peripheral end of the first substrate opposed plate 8 is positioned outward from a peripheral end of the substrate W on the lower surface of the substrate.

A peripheral edge portion of the first substrate opposed plate 8 is formed with a plurality of insertion recesses 20 in positions corresponding to the holding members 5. The insertion recess 20 is an insertion hole penetrating in a thickness direction of the first substrate opposed plate 8. A corresponding holding member 5 is inserted into each insertion recess 20. A center portion of the first substrate opposed plate 8 is formed with an opening 21 in a manner of surrounding an outer peripheral surface of the processing liquid supply pipe 13 and the inert gas supply pipe 14. That is, the first substrate opposed surface 8a has an annular shape surrounding the second substrate opposed surface (second opposed surface) 16a of the second substrate opposed plate 16 in plan view. The opening 21 of the first substrate opposed plate 8 is formed with a step portion 19. The step portion 19 is provided with respect to a radial direction of the first substrate opposed plate 8 (left and right direction in FIG. 1) in a manner to align with the flange 18 of the second substrate opposed plate 16.

The first substrate opposed plate 8 is formed in a manner capable of going up and down between a lower position (position shown by a solid line in FIG. 1) near the upper surface of the spin base 4 and a first approximate position (position shown by a broken line in FIG. 1) approximating at a small distance the lower surface of the substrate W held by the holding members above the lower position. When the first substrate opposed plate 8 is in the first approximate position, the step portion 19 of the first substrate opposed plate 8 and the flange 18 of the second substrate opposed plate 16 are mated, and the first substrate opposed surface 8a of the first substrate opposed plate 8 and the second substrate opposed surface 16a of the second substrate opposed plate 16 are positioned on the same plane. Up and down of the first substrate opposed plate 8 is controlled by a magnetic levitation mechanism 24 attached to a lower surface of the first substrate opposed plate 8.

The magnetic levitation mechanism 24 comprises a guide mechanism 25, a magnet holding member 26, an opposed-plate-side permanent magnet 27, a up and down permanent magnet 28 and an up and down actuator 29.

The guide mechanism 25 comprises a guide shaft 30 attached to the lower surface of the first substrate opposed plate 8 and extending vertically in parallel to the rotation axis line 10, and a linear bearing 31 coupled to the guide shaft 30. The guide shaft 30 is arranged in a position between the rotation shaft 6 and the holding member 5. More specifically, guide shafts 30 are arranged in three positions spaced at the same distance in a circumferential direction of the first substrate opposed plate 8, as shown in FIG. 2. The guide shaft 30 is coupled to the linear bearing 31 provided in a corresponding location of the spin base 4, and can go up and down vertically while being guided by the linear bearing 31. Thus, the first substrate opposed plate 8 is guided along an up and down direction parallel to the rotation axis line 10 by the guide shafts 30 and the linear bearing 31.

The guide shaft 30 penetrates the linear bearing 31, and comprises at its lower end a flange 32 protruding outwardly. When the flange 32 abuts a lower end of the linear bearing 31, upward movement of the guide shaft 30, that is, upward movement of the first substrate opposed plate 8 is restricted. That is, the flange 32 is a restricting member which restricts the upward movement of the first substrate opposed plate 8.

The magnet holding member 26 holds the opposed-plate-side permanent magnet 27 in a manner that a magnetic pole direction is directed in the up-and-down direction. The magnet holding member 26 is secured to the lower surface of the first substrate opposed plate 8 at a position which is an outside farther from the rotation axis line 10 than the guide shaft 30 and is an inside nearer to the rotation axis line 10 than the holding member 5.

As shown in FIG. 2, for example, magnet holding members 26 are provided on six places spaced at the same distance in the circumferential direction of the first substrate opposed plate 8. More specifically, each magnet holding member 26 is arranged in an angular position corresponding a position between (in a middle of, in this embodiment) adjacent holding members 5 when viewed from the rotation axis line 10. Further, three guide shafts 30 are respectively arranged in every other angular regions (in center positions of the angular regions, in this embodiment) of six angular regions divided (divided equally, in this embodiment) by the six magnet holding members 26 when viewed from the rotation axis line 10.

The spin base 4 is provided with through holes 33 in six locations corresponding to the six magnet holding members 26. Each through hole 33 is formed in a manner to be capable of making each corresponding magnet holding member 26 inserted through in the vertical direction parallel to the rotation axis line 10. When the first substrate opposed plate 8 is in the lower position, as shown in FIG. 1, the magnet holding member 26 is inserted through the through hole 33 to protrude downwardly from a lower surface of the spin base 4, and the opposed-plate-side permanent magnet 27 is positioned downwardly from the lower surface of the spin base 4. The opposed-plate-side permanent magnet 27 may be secured to the magnet holding member 26 such that it has a south pole on a lower side and a north pole on an upper side, for example.

The up and down permanent magnet 28 is, for example, a circular permanent magnet arranged along a horizontal plane around the rotation axis line 10, and have a circular magnetic pole opposed to the opposed-plate-side permanent magnet 27 from downward. A polarity of the magnetic pole of the up and down permanent magnet 28 is the same as a magnetic pole of the lower side of the opposed-plate-side permanent magnet 27. Thus, the up and down permanent magnet 28 generates an upward repulsive magnetic force to the opposed-plate-side permanent magnet 27. The up and down permanent magnet 28 is accommodated in and held by a circular up and down permanent magnet holding member 35. An operation shaft 34 of the up and down actuator 29 is coupled to the up and down permanent magnet holding member 35.

The up and down actuator 29 comprises, for example, an air cylinder, and is configured to move the operation shaft 34 up and down in the direction parallel to the rotation axis line 10. The up and down actuator 29 can make the up and down permanent magnet 28 go up and down between an upper position and a lower position. The lower position is set such that the up and down permanent magnet 28 is sufficiently downward from the spin base 4, and that a distance sufficient for making a magnetic repulsive force between the up and down permanent magnet 28 and the opposed-plate-side permanent magnet 27 lower than a gravity acted on the first substrate opposed plate 8 is secured between the up and down permanent magnet 28 and the opposed-plate-side permanent magnet 27. The upper position is higher than the lower position, and is set such that the first substrate opposed plate 8 coupled to the magnet holding member 26 is raised to the first approximate position by the magnetic repulsive force between the up and down permanent magnet 28 and the opposed-plate-side permanent magnet 27.

Therefore, when the up and down actuator 29 is operated to raise the up and down permanent magnet 28 from the lower position to the upper position, during this process, the magnetic repulsive force between the up and down permanent magnet 28 and the opposed-plate-side permanent magnet 27 exceeds the gravity acted on the first substrate opposed plate 8 and other rising resistance force (frictional force and the like). As a result of this, the first substrate opposed plate 8 floats from the upper surface of the spin base 4 to rise to the first approximate position. Rise of the first substrate opposed plate 8 is restricted by that the flange 32 provided on the lower end of the guide shaft 30 abuts the lower end of the linear bearing 31.

On the other hand, when the up and down actuator 29 is operated to lower the up and down permanent magnet 28 from the upper position to the lower position, during this process, the gravity acted on the first substrate opposed plate 8 exceeds the magnetic repulsive force between the up and down permanent magnet 28 and the opposed-plate-side permanent magnet 27 and other lowering resistance force (frictional force and the like). As a result of this, the first substrate opposed plate 8 lowers from the first approximate position to reach the spin base 4.

The substrate processing apparatus 1 further comprises an upper surface chemical liquid supply mechanism 42 supplying a chemical liquid (processing liquid) to the upper surface of the substrate W, an upper surface rinsing liquid supply mechanism 43 supplying a rinsing liquid (processing liquid, cleaning liquid) to the upper surface of the substrate W, a lower surface chemical liquid supply mechanism 54 supplying the chemical liquid to the lower surface of the substrate W, a lower surface rinsing liquid supply mechanism 55 supplying a rinsing liquid to the lower surface of the substrate W, and an inert gas supply mechanism 64 supplying an inert gas to the lower surface of the substrate W.

The upper surface chemical liquid supply mechanism 42 comprises an upper surface chemical liquid nozzle 44, an upper surface chemical liquid supply piping 45 and an upper surface chemical liquid valve 46. The upper surface chemical liquid supply piping 45 is connected to the upper surface chemical liquid nozzle 44. The upper surface chemical liquid valve 46 is interposed in the upper surface chemical liquid supply piping 45. When the upper surface chemical liquid valve 46 is opened, the chemical liquid is supplied from the upper surface chemical liquid supply piping 45 to the upper surface chemical liquid nozzle 44, and the chemical liquid is discharged from the upper surface chemical liquid nozzle 44. Further, when the upper surface chemical liquid valve 46 is closed, supply of the chemical liquid from the upper surface chemical liquid supply piping 45 to the upper surface chemical liquid nozzle 44 is stopped. The chemical liquid discharged from the upper surface chemical liquid nozzle 44 is supplied to a center portion of the upper surface of the substrate W held by the spin chuck 3.

The upper surface rinsing liquid supply mechanism 43 comprises an upper surface rinsing liquid nozzle 49, an upper surface rinsing liquid supply piping 50 and an upper surface rinsing liquid valve 51. The upper surface rinsing liquid supply piping 50 is connected to the upper surface rinsing liquid nozzle 49. The upper surface rinsing liquid valve 51 is interposed in the upper surface rinsing liquid supply piping 50. When the upper surface rinsing liquid valve 51 is opened, the rinsing liquid is supplied from the upper surface rinsing liquid supply piping 50 to the upper surface rinsing liquid nozzle 49, and the rinsing liquid is discharged from the upper surface rinsing liquid nozzle 49. Further, when the upper surface rinsing liquid valve 51 is closed, the supply of the rinsing liquid from the upper surface rinsing liquid supply piping 50 to the upper surface rinsing liquid nozzle 49 is stopped. The rinsing liquid discharged from the upper surface rinsing liquid nozzle 49 is supplied to the center portion of the upper surface of the substrate W held by the spin chuck 3.

Also, the upper surface chemical liquid nozzle 44 is not necessarily arranged in a fixed manner with respect to the spin chuck 3. For example, the upper surface chemical liquid nozzle 44 may be in a form of a so-called scan nozzle which is attached to an arm capable of swinging in a horizontal plane above the spin chuck 3 and scans a contact position of the chemical liquid on the surface of the substrate W by a swinging movement of the arm. Further, the upper surface rinsing liquid nozzle 49 is also not necessarily arranged in a fixed manner with respect to the spin chuck 3 and may be in a form of a so-called scan nozzle.

The lower surface chemical liquid supply mechanism 54 comprises a lower surface chemical liquid supply piping 57, a lower surface chemical liquid valve 58 and a chemical liquid flow rate adjusting valve 59. The lower surface chemical liquid supply piping 57 is connected to a processing liquid supply piping 60. The processing liquid supply piping 60 is connected to the processing liquid supply pipe 13 which is inserted through the rotation shaft 6. The lower surface chemical liquid valve 58 and the chemical liquid flow rate adjusting valve 59 are interposed in the lower surface chemical liquid supply piping 57. When a lower surface rinsing liquid valve 62 described below is closed, and at the same time, the lower surface chemical liquid valve 58 is opened, the chemical liquid is supplied to the processing liquid supply pipe 13 through the lower surface chemical liquid supply piping 57 and the processing liquid supply piping 60. Further, when lower surface chemical liquid valve 58 is closed, supply of the chemical liquid to the processing liquid supply pipe 13 is stopped. The chemical liquid supplied to the processing liquid supply pipe 13 is discharged from the processing liquid dispense port 17 of the lower surface nozzle 15 to a center portion of the lower surface of the substrate W held by the spin chuck 3. The chemical liquid flow rate adjusting valve 59 adjusts a discharge flow rate of the chemical liquid discharged from the lower surface nozzle 15 by adjusting an opening amount of the lower surface chemical liquid supply piping 57.

The lower surface rinsing liquid supply mechanism 55 comprises a lower surface rinsing liquid supply piping 61, a lower surface rinsing liquid valve 62 and a rinsing liquid flow rate adjusting valve 63. The lower surface rinsing liquid supply piping 61 is connected to the processing liquid supply piping 60 like the lower surface chemical liquid supply piping 57. The lower surface rinsing liquid valve 62 and the rinsing liquid flow rate adjusting valve 63 are interposed in the lower surface rinsing liquid supply piping 61. When the lower surface chemical liquid valve 58 is closed, and at the same time, the lower surface rinsing liquid valve 62 is opened, the rinsing liquid is supplied to the processing liquid supply pipe 13 through the lower surface rinsing liquid supply piping 61 and the processing liquid supply piping 60. Further, when the lower surface rinsing liquid valve 62 is closed, the supply of the rinsing liquid to the processing liquid supply pipe 13 is stopped. The rinsing liquid supplied to the processing liquid supply pipe 13 is discharged from the processing liquid dispense port 17 of the lower surface nozzle 15 to the center portion of the lower surface of the substrate W held by the spin chuck 3. The rinsing liquid flow rate adjusting valve 63 adjusts a discharge flow rate of the rinsing liquid discharged from the lower surface nozzle 15 by adjusting an opening amount of the lower surface rinsing liquid supply piping 61.

Also, in this embodiment, the lower surface chemical liquid supply piping 57 and the lower surface rinsing liquid supply piping 61 are connected to the processing liquid supply pipe 13 through the processing liquid supply piping 60 which is a common piping. However, the lower surface chemical liquid supply piping 57 and the lower surface rinsing liquid supply piping 61 may be directly connected to the processing liquid supply pipe 13.

The inert gas supply mechanism 64 comprises an inert gas supply piping 65, an inert gas valve 66 and an inert gas flow rate adjusting valve 67. The inert gas supply piping 65 is connected to the inert gas supply pipe 14 which is inserted through the rotation shaft 6. The inert gas valve 66 and the inert gas flow rate adjusting valve 67 are interposed in the inert gas supply piping 65. When the inert gas valve 66 is opened, an inert gas is supplied from the inert gas supply piping 65 to the inert gas supply pipe 14. Further, when the inert gas valve 66 is closed, supply of the inert gas from the inert gas supply piping 65 to the inert gas supply pipe 14. The inert gas flow rate adjusting valve 67 adjusts a discharge flow rate of the inert gas discharged from an upper end of the inert gas supply pipe 14 by adjusting an opening amount of the inert gas supply piping 65.

When the first substrate opposed plate 8 is in the lower position, the inert gas discharged from the vertical upper end of the inert gas supply pipe 14 passes a lower portion of the flange 18 of the second substrate opposed plate 16 and a space between the lower surface of the substrate W and the first substrate opposed surface 8a of the first substrate opposed plate 8 to be guided to outside of a rotation range of the substrate W. Further, when the first substrate opposed plate 8 is in the first approximate position, the inert gas passes the lower portion of the flange 18 of the second substrate opposed plate 16 and a space between the upper surface of the spin base 4 and the lower surface of the first substrate opposed plate 8 to be guided to outside of the rotation range of the substrate W.

The chemical liquid supplied to the upper surface chemical liquid nozzle 44 and the lower surface nozzle 15 includes, for example, an etchant such as HF (hydrogen fluoride), TMAH (tetramethylammonium hydroxide) and SC1 (ammonia-hydrogen peroxide mixture). Further, the rinsing liquid supplied to the upper surface rinsing liquid nozzle 49 and the lower surface nozzle 15 includes, for example, pure water (deionized water), carbonated water, electrolytic ionized water, hydrogen water, ozone water, and dilute hydrochloric acid water (whose dilute concentration is, for example, about 10 to 100 ppm). Further, the inert gas supplied to the inert gas supply pipe 14 is, for example, nitrogen gas.

The substrate processing apparatus 1 comprises a controlling device 69 for controlling respective portions of this substrate processing apparatus 1. The controlling device 69 is configured to control the spin drive mechanism 7, the substrate-holding-member movable mechanism 9, the up and down actuator 29 and the like. Further, the substrate processing apparatus 1 controls opening and closing of the upper surface chemical liquid valve 46, the upper surface rinsing liquid valve 51, the lower surface chemical liquid valve 58, the lower surface rinsing liquid valve 62, the inert gas valve 66 and the like as well as the opening amounts of the chemical liquid flow rate adjusting valve 59, the rinsing liquid flow rate adjusting valve 63, the inert gas flow rate adjusting valve 67 and the like.

Figure 3:
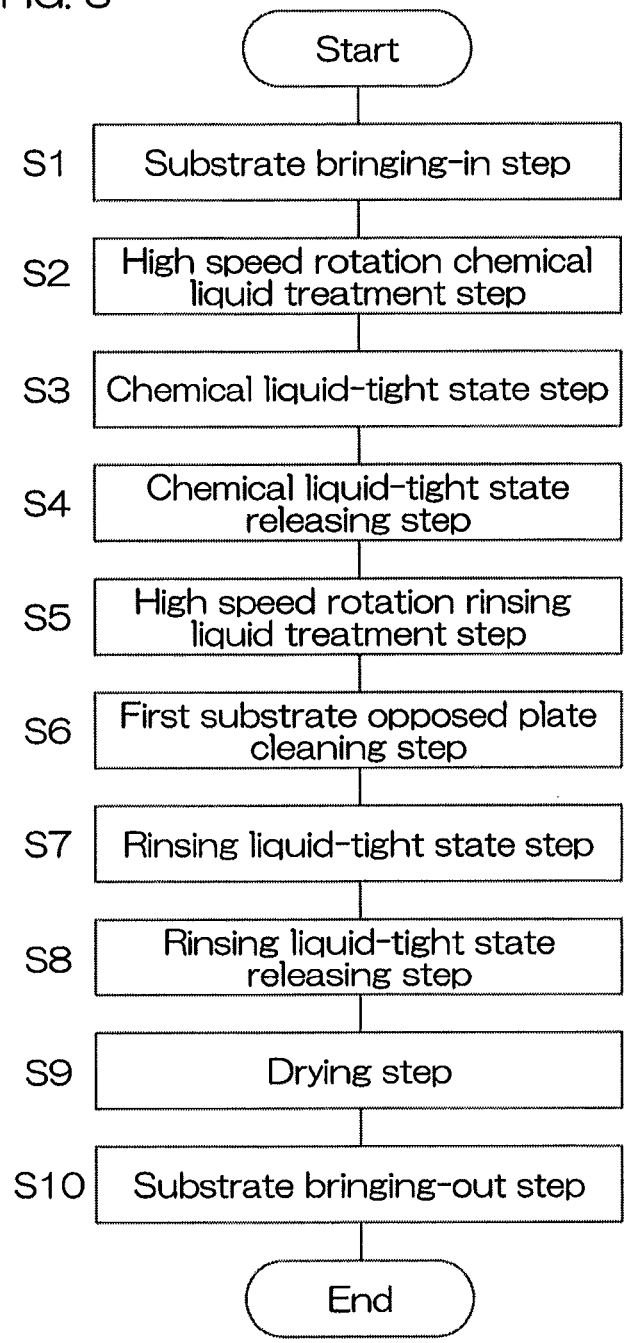
FIG. 3 is a flow chart showing a process example of the substrate processing apparatus of FIG. 1.
Figure 4:
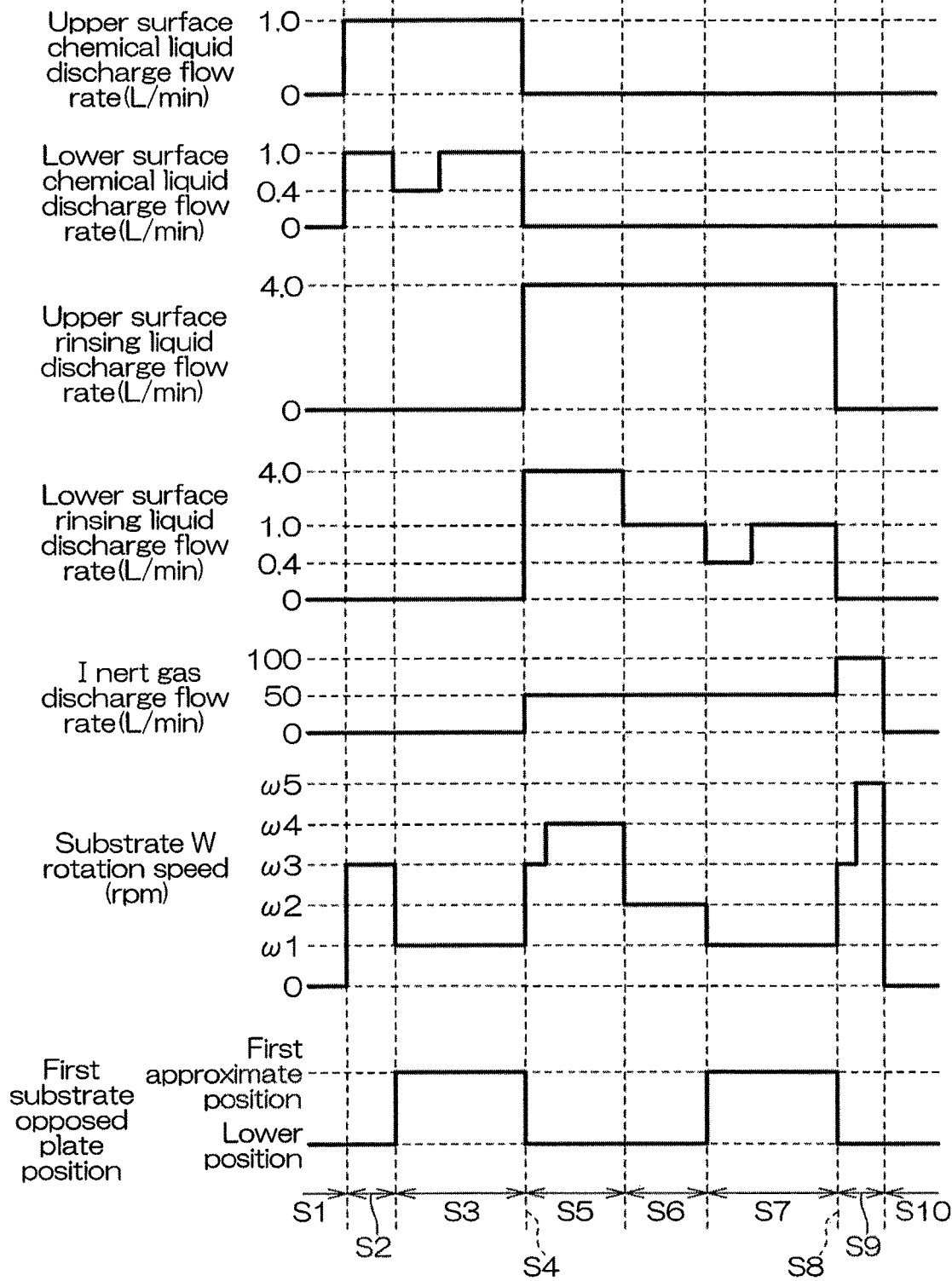
FIG. 4 is a time chart showing the process example of the substrate processing apparatus of FIG. 1.

FIG. 3 is a flow chart showing a process example of the substrate processing apparatus 1. FIG. 4 is a time chart showing the process example of the substrate processing apparatus 1. FIGS. 5A to 5J are views illustrating the process example in FIGS. 3 and 4. Referring to FIGS. 1, 3, 4 and 5A to 5J, the process example of the substrate processing apparatus 1 is described.

Figure 5A:
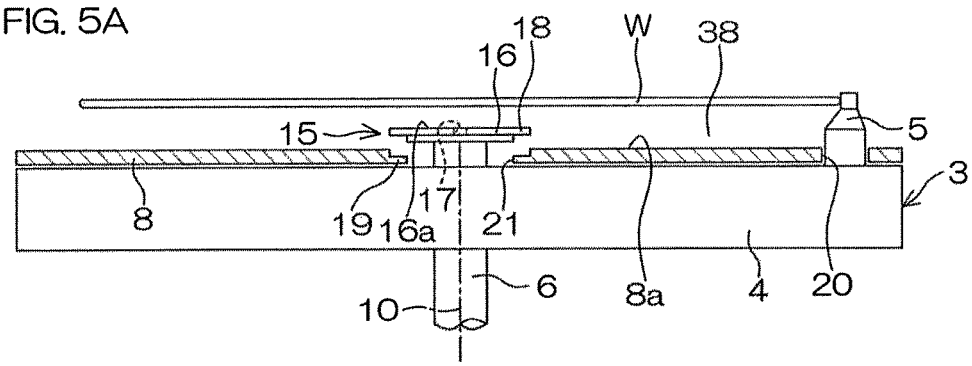
FIGS. 5A to 5C are views illustrating the process example in FIGS. 3 and 4.

In the process example of FIG. 3, an untreated substrate W is first brought into the processing chamber 2 by a substrate transporting robot not shown, and as shown in FIG. 5A, the substrate W is held by the spin chuck 3 with a device formation surface of the substrate W faced upward (S1: substrate bringing-in step). When the substrate W is transported, the first substrate opposed plate 8 is arranged in the lower position, as shown in FIG. 5A.

Figure 5B:
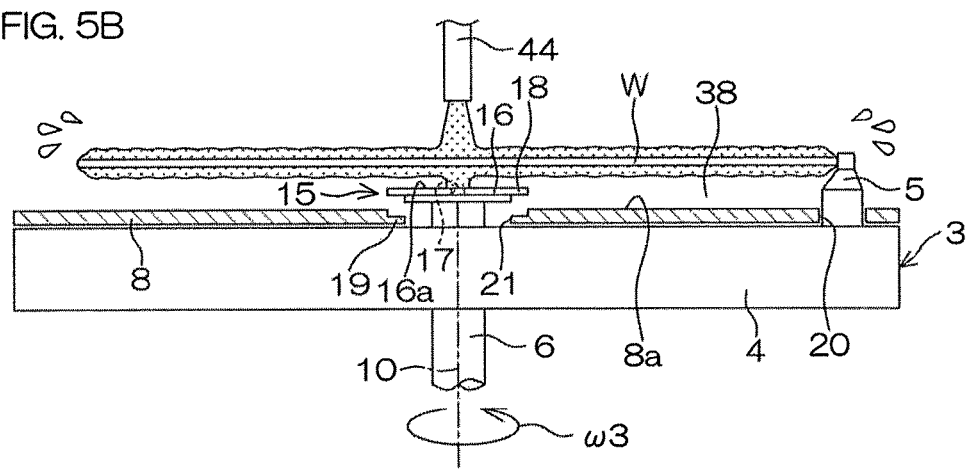

Then, as shown in FIG. 5B, the controlling device 69 controls the spin drive mechanism 7 to rotate the substrate W from a resting state around the rotation axis line 10 at a high speed of a rotation speed (second rotation speed) ω3 (for example, 500 rpm). Further, the controlling device 69 opens the upper surface chemical liquid valve 46 to supply the chemical liquid to the upper surface of the substrate W, and at the same time, opens the lower surface chemical liquid valve 58 to supply the chemical liquid to the lower surface of the substrate W (S2: high speed rotation chemical liquid treatment step). The discharge flow rates of the chemical liquid discharged from the upper surface chemical liquid nozzle 44 and the lower surface nozzle 15 are respectively 1.0 L/min, for example.

In the high speed rotation chemical liquid treatment step of step S2, the chemical liquid discharged from the upper surface chemical liquid nozzle 44 contacts the center portion of the upper surface of the substrate W, and then spreads to a peripheral edge portion of the upper surface of the substrate W by a rotational centrifugal force of the substrate W. Thus, an entire upper surface of the substrate W is treated by the chemical liquid. Further, the chemical liquid discharged from the lower surface nozzle 15 contacts the center portion of the lower surface of the substrate W, and then spreads along the lower surface of the substrate W to a peripheral edge portion of the lower surface by the rotational centrifugal force of the substrate W. Thus, an entire lower surface of the substrate W is treated by the chemical liquid.

Figure 5C:
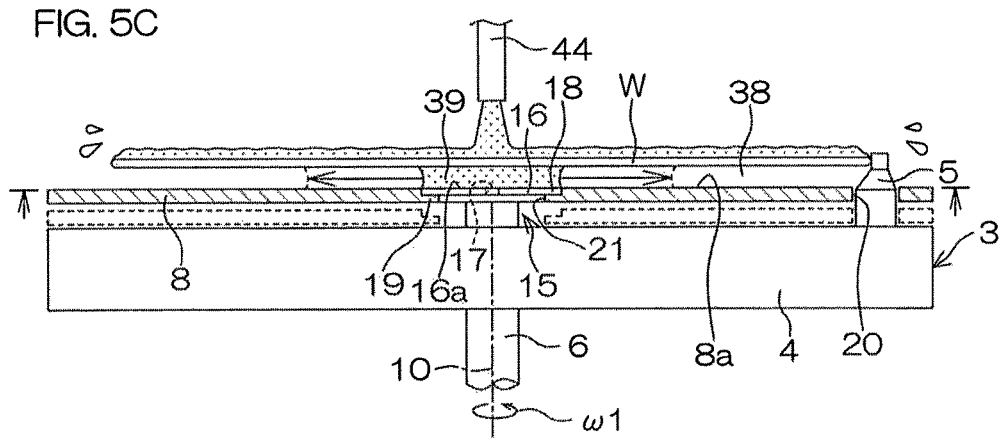

When a predetermined time (for example, 5 sec) passes from start of discharge of the chemical liquid, the controlling device 69 controls the spin drive mechanism 7 to decelerate the rotation of the substrate W from the rotation speed ω3 to a lower rotation speed ω1 (first rotation speed; for example, 10 rpm), as shown in FIG. 5C. Further, the controlling device 69 controls the chemical liquid flow rate adjusting valve 59 to reduce the discharge flow rate of the chemical liquid from the lower surface nozzle 15 from 1.0 L/min to 0.4 L/min, for example. Further, the controlling device 69 controls the up and down actuator 29 to raise the first substrate opposed plate 8 from the lower position (see FIG. 5B) to the first approximate position (see FIG. 5C). Thus, the chemical liquid is cause to be in a liquid-tight state in a space 38 between the lower surface of the substrate W and the first substrate opposed surface 8a in the first approximate position. The lower surface of the substrate W is treated by the chemical liquid in the liquid-tight state (S3: chemical liquid-tight state step).

Specifically, in the chemical liquid-tight state step of step S3, the first substrate opposed surface 8a of the first substrate opposed plate 8 and the second substrate opposed surface 16a of the lower surface nozzle 15 are arranged on the same plane, as shown in FIG. 5C. Further, while the first substrate opposed plate 8 is arranged in the first approximate position, an outwardly cylindrical liquid column 39 of the chemical liquid is formed between the lower surface of the substrate W and the second substrate opposed surface 16a of the second substrate opposed plate 16 by the deceleration of the substrate W.

It is desirable that the discharge flow rate of the chemical liquid is small to maintain the liquid column 39 of the chemical liquid. However, a predetermined amount of the chemical liquid is required at formation of the liquid column 39 of the chemical liquid. In this process example, since the chemical liquid at a relatively large flow rate is supplied to the lower surface of the substrate W in the high speed rotation chemical liquid treatment step of step S2, a relatively large amount of the chemical liquid exists on the lower surface of the substrate W at a start of the chemical liquid-tight state step of S3. Therefore, the liquid column 39 of the chemical liquid can be favorably formed.

Further, the liquid column 39 of the chemical liquid is expanded in a circumferential direction of the substrate W by further supplying the chemical liquid to the liquid column 39 of the chemical liquid. The liquid column 39 of the chemical liquid between the lower surface of the substrate W and the second substrate opposed surface 16a of the second substrate opposed plate 16 expands along between the lower surface of the substrate W and the first substrate opposed surface 8a of the first substrate opposed plate 8 in the space 38 between the lower surface of the substrate W and the first substrate opposed surface 8a toward a peripheral edge portion of the substrate W (see arrows in FIG. 5C). Thus, the chemical liquid reaches the liquid-tight state in the entire space 38. Since the liquid-tight state in the entire space 38 can be achieved by a small flow rate of the chemical liquid, a consumption of the chemical liquid can be reduced by this.

Further, since the insertion recess 20 for allowing each holding member 5 inserted through is formed in the first substrate opposed plate 8, the holding member 5 and the first substrate opposed plate 8 do not contact when the first substrate opposed plate 8 is raised from the lower position to the first approximate position. Thus, the first substrate opposed plate 8 can go favorably up and down.

Figure 5D:
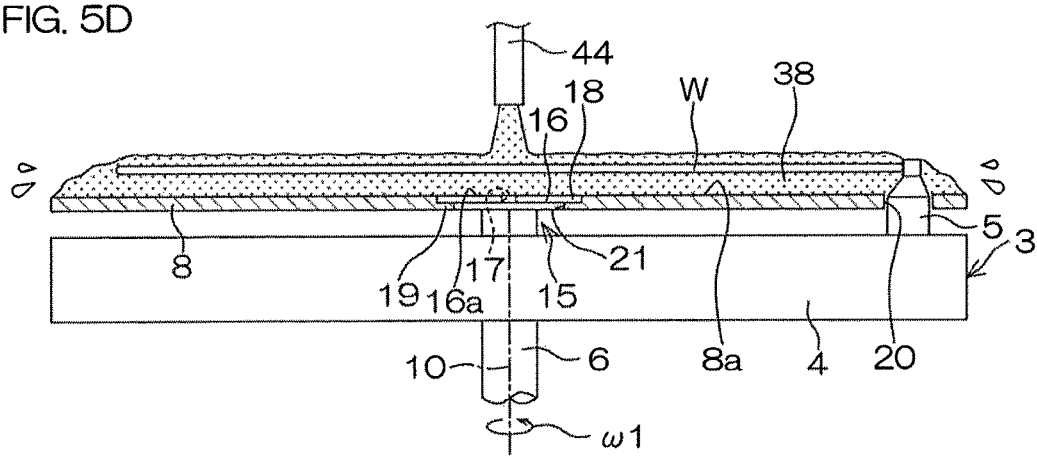
FIGS. 5D to 5F are views illustrating a step following FIG. 5C.

When a predetermined time (for example, 5 sec) passes after the first substrate opposed plate 8 is raised to the first approximate position, the controlling device 69 controls the chemical liquid flow rate adjusting valve 59, as shown in FIGS. 3, 4 and 5D, to increase the discharge flow rate of the chemical liquid from the lower surface nozzle 15, for example, from 0.4 L/min to 1.0 L/min.

As a result, a flow rate of the chemical liquid supplied to the space 38 increases, and this makes it possible that the space 38 is caused to be in a liquid-tight state of the chemical liquid on the entire lower surface of the substrate W. In this state, since the chemical liquid contacts the entire lower surface of the substrate W, the entire lower surface of the substrate W can be favorably and uniformly treated by the chemical liquid. Further, since the chemical liquid treatment to the upper surface of the substrate W and the chemical liquid treatment to the lower surface of the substrate W are performed at the same time, a treatment time can be decreased compared to a case where the upper and lower surfaces of the substrate W are individually subjected to the chemical liquid treatment.

Further, as shown in FIG. 5D, the peripheral edge portion of the first substrate opposed plate 8 overhangs outwardly from each insertion recess 20, and a thick portion is provided between each insertion recess 20 and the outer peripheral end of the first substrate opposed plate 8. This thick portion makes it possible that in the chemical liquid-tight state step of step S3, the peripheral edge portion of the substrate W including a portion held by the holding members 5 is also caused to be in the liquid-tight state. As a result, the liquid-tight state with the chemical liquid can be reliably and favorably achieved on the entire lower surface of the substrate W.

Thus, when the substrate W is treated by the chemical liquid, the lower surface of the substrate W is treated by the chemical liquid in the high speed rotation chemical liquid treatment step of step S2, and then the lower surface of the substrate W is treated by the chemical liquid in the chemical liquid-tight state step of step S3. Therefore, the lower surface of the substrate W can be treated by the chemical liquid more favorably.

Figure 5E:
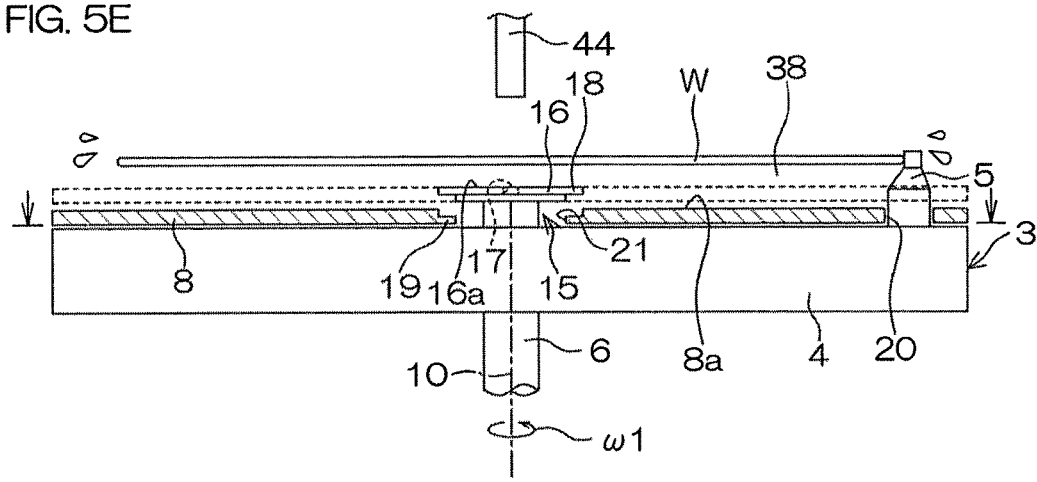

Then, when a predetermined time (for example, 20 sec) passes after the discharge flow rate of the chemical liquid from the lower surface nozzle 15 is increased, the controlling device 69 closes the upper surface chemical liquid valve 46 and the lower surface chemical liquid valve 58, and, as shown in FIG. 5E, stops the supply of the chemical liquid to the substrate W. Further, the controlling device 69 controls the up and down actuator 29 to lower the first substrate opposed plate 8 from the first approximate position (see FIG. 5D) to the lower position (see FIG. 5E). As a result, the first substrate opposed surface 8a of the first substrate opposed plate 8 is separated from the lower surface of the substrate W, and the liquid-tight state of the chemical liquid between the lower surface of the substrate W and the first substrate opposed surface 8a of the first substrate opposed plate 8 is instantaneously released (S4: chemical liquid-tight state releasing step).

Further, the controlling device 69 controls the spin drive mechanism 7 to accelerate the rotation of the substrate W from the rotation speed ω1 to the rotation speed ω3. Further, the controlling device 69 opens the upper surface rinsing liquid valve 51 to supply the rinsing liquid to the upper surface of the substrate W, and at the same time, opens the lower surface rinsing liquid valve 62 to supply the rinsing liquid to the lower surface of the substrate W (S5: high speed rotation rinsing liquid treatment step). Flow rates of the rinsing liquid discharged from the upper surface rinsing liquid nozzle 49 and the lower surface nozzle 15 are respectively, for example, 4.0 L/min. Further, the controlling device 69 opens the inert gas valve 66 to supply the inert gas to the space 38 between the lower surface of the substrate W and the first substrate opposed surface 8a. A discharge flow rate of the inert gas is, for example, 50 L/min.

In the high speed rotation rinsing liquid treatment step of step S5, the rinsing liquid discharged from the upper surface rinsing liquid nozzle 49 contacts the center portion of the upper surface of the substrate W, and then spreads to the peripheral edge portion of the upper surface of the substrate W by the rotational centrifugal force of the substrate W. Thus, the chemical liquid adhering to the upper surface of the substrate W is washed out by the rinsing liquid on the entire upper surface of the substrate W. Further, the inert gas discharged from the vertical upper end of the inert gas supply pipe 14 passes the lower portion of the flange 18 of the second substrate opposed plate 16 and is blown out radially around the rotation axis line 10. This inert gas passes the space between the lower surface of the substrate W and the first substrate opposed surface 8a of the first substrate opposed plate 8 to be ejected to outside the rotation range of the substrate W. Thus, the rinsing liquid and a liquid drop of the chemical liquid washed out by the rinsing liquid can be prevented from entering the inert gas supply pipe 14 and the processing liquid dispense port 17 of the lower surface nozzle 15.

Figure 5F:
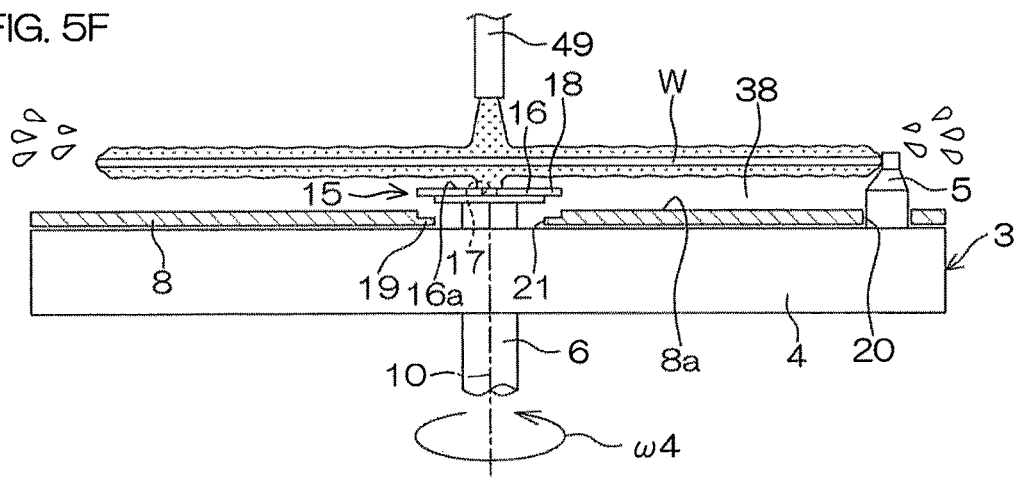

When a predetermined time (for example, 1 sec) passes from a start of discharge of the rinsing liquid, the controlling device 69 controls the spin drive mechanism 7 to accelerate the rotation of the substrate W from the rotation speed ω3 to a further higher rotation speed ω4 (second rotation speed; for example, 1000 rpm), as shown in FIG. 5F. Thus, the rinsing liquid discharged from the lower surface nozzle 15 contacts the center portion of the lower surface of the substrate W, and then spreads to the peripheral edge portion of the lower surface of the substrate W along the lower surface of the substrate W by the rotational centrifugal force of the substrate W. Thus, the chemical liquid adhering to the lower surface of the substrate W is washed out by the rinsing liquid on the entire lower surface of the substrate W. Further, in this state, since the rinsing liquid discharged from the upper surface rinsing liquid nozzle 49 is also kept being supplied to the entire upper surface of the substrate W, a rinsing treatment is favorably performed on the entire upper and lower surfaces of the substrate W.

Figure 5G:
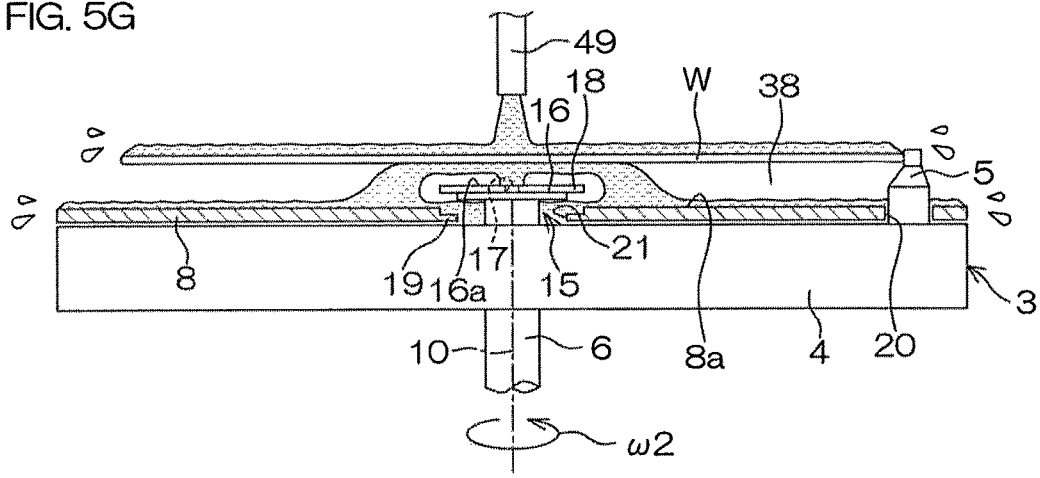
FIGS. 5G to 5I are views illustrating a step following FIG. 5F.

Then, when a predetermined time (for example, 10 sec) passes from the acceleration of the substrate W, the controlling device 69 controls the spin drive mechanism 7 to decelerate the rotation of the substrate W to a rotation speed ω2 (third rotation speed; for example, 100 rpm) which is slower than the rotation speed ω3 but faster than the rotation speed ω1, as shown in FIG. 5G. Further, the controlling device 69 controls the rinsing liquid flow rate adjusting valve 63 to decrease the discharge flow rate of the rinsing liquid from the lower surface nozzle 15, for example, from 4.0 L/min to 1.0 L/min.

At this time, the rinsing liquid supplied to the center portion of the lower surface of the substrate W spreads to the peripheral edge portion on the lower surface of the substrate W, then falls downwardly by the gravity, is supplied to the first substrate opposed surface 8a of the first substrate opposed plate 8, and flows along the first substrate opposed surface 8a of the first substrate opposed plate 8. An entire outer surface of the first substrate opposed plate 8 including the first substrate opposed surface 8a is cleaned by the rinsing liquid flowing on the first substrate opposed surface 8a (S6: first substrate opposed plate cleaning step).

Figure 5H:
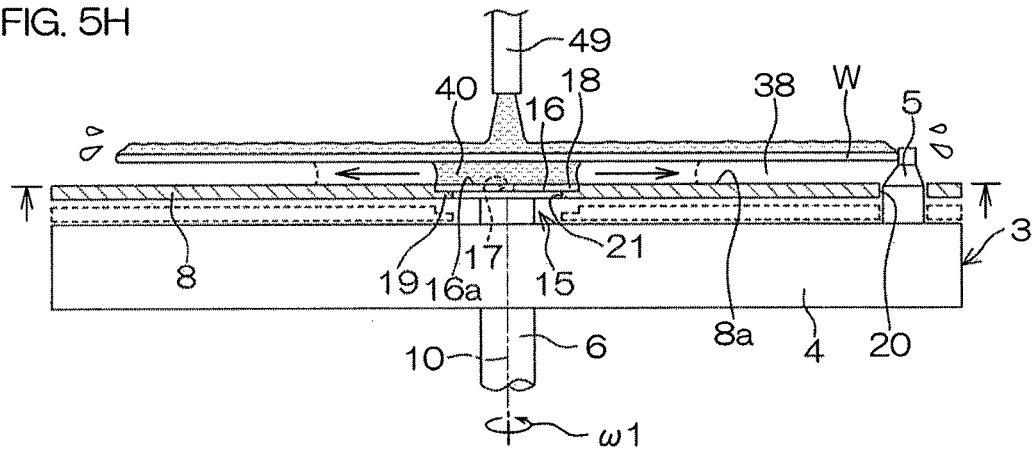

Then, when a predetermined time (for example, 10 sec) passes from the deceleration of the substrate W, the controlling device 69 controls the spin drive mechanism 7 to decelerate the rotation of the substrate W from the rotation speed ω2 to the rotation speed ω1, as shown in FIG. 5H. Further, the controlling device 69 controls the rinsing liquid flow rate adjusting valve 63 to decrease the discharge flow rate of the rinsing liquid from the lower surface nozzle 15, for example, from 1.0 L/min to 0.4 L/min.

Further, the controlling device 69 controls the up and down actuator 29 to raise the first substrate opposed plate 8 from the lower position (see FIG. 5G) to the first approximate position (see FIG. 5H). Thus, the rinsing liquid is caused to be in a liquid-tight state in the space 38 between the lower surface of the substrate W and the first substrate opposed surface 8a in the first approximate position. The lower surface of the substrate W is treated by the rinsing liquid in the liquid-tight state (S7: rinsing liquid-tight state step).

Specifically, in the rinsing liquid-tight state step of step S7, as shown in FIG. 5H, the first substrate opposed surface 8a of the first substrate opposed plate 8 and the second substrate opposed surface 16a of the lower surface nozzle 15 are arranged on the same plane. Further, with the first substrate opposed plate 8 positioned in the first approximate position, an outwardly cylindrical liquid column 40 of the rinsing liquid is formed between the lower surface of the substrate W and the second substrate opposed surface 16a of the second substrate opposed plate 16 by the deceleration of the substrate W.

It is desirable to maintain the liquid column 40 of the rinsing liquid that the discharge flow rate of the rinsing liquid is small. However, a predetermined amount of the rinsing liquid is required when the liquid column 40 of the rinsing liquid is formed. In this process example, a relatively large amount of the rinsing liquid is supplied to the lower surface of the substrate W in the high speed rotation rinsing liquid treatment step of step S5. Thus, a relatively large amount of the rinsing liquid exists on the lower surface of the substrate W at a start of the rinsing liquid-tight state step of step S7. Therefore, the liquid column 40 of the rinsing liquid can be favorably formed.

Further, the liquid column 40 of the rinsing liquid is expanded in the circumferential direction of the substrate W by further supplying the rinsing liquid to the liquid column 40 of the rinsing liquid. The liquid column 40 of the rinsing liquid between the lower surface of the substrate W and the second substrate opposed surface 16a of the second substrate opposed plate 16 expands along between the lower surface of the substrate W and the first substrate opposed surface 8a of the first substrate opposed plate 8 in the space 38 between the lower surface of the substrate W and the first substrate opposed surface 8a toward the peripheral edge portion of the substrate W (see arrows in FIG. 5H). Thus, the rinsing liquid reaches the liquid-tight state in the entire space 38. Since the liquid-tight state in the entire space 38 can be achieved by a small flow rate of the rinsing liquid, a consumption of the rinsing liquid can be reduced.

When a predetermined time (for example, 5 sec) passes after the first substrate opposed plate 8 is raised to the first approximate position, the controlling device 69 controls the rinsing liquid flow rate adjusting valve 63 to increase the discharge flow rate of the rinsing liquid from the lower surface nozzle 15, for example, from 0.4. L/min to 1.0 L/min.

As a result, a flow rate of the rinsing liquid supplied to the space 38 increases, and this makes it possible that the space 38 is caused to be in a liquid-tight state with the rinsing liquid on the entire lower surface of the substrate W. Thus, the rinsing liquid contacts the entire lower surface of the substrate W, and therefore, the entire lower surface of the substrate W can be favorably and uniformly treated by the rinsing liquid. Further, since a rinsing liquid treatment to the upper surface of the substrate W and the rinsing liquid treatment to the lower surface of the substrate W are performed at the same time, a treatment time can be decreased compared to a case where the upper and lower surfaces of the substrate W are individually subjected to the rinsing liquid treatment.

Figure 5I:
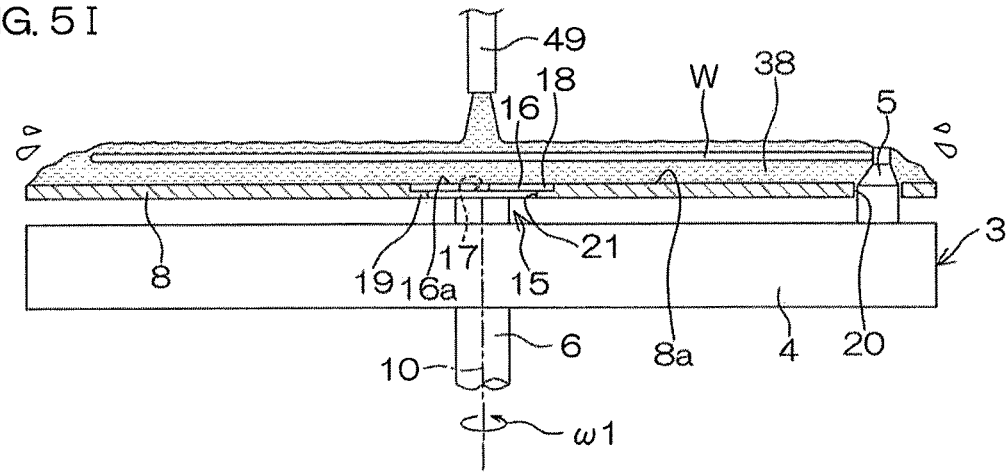

Further, as shown in FIG. 5I, the peripheral edge portion of the first substrate opposed plate 8 overhangs outwardly from each insertion recess 20, and the thick portion is provided between each insertion recess 20 and the outer peripheral end of the first substrate opposed plate 8. This thick portion makes it possible that in the rinsing liquid-tight state step of step S7, the peripheral edge portion of the substrate W including the portion held by the holding members 5 is also caused to be in the liquid-tight state. As a result, the liquid-tight state with the rinsing liquid can be reliably and favorably achieved on the entire lower surface of the substrate W.

Thus, when the substrate W is treated by the rinsing liquid, the lower surface of the substrate W is treated by the rinsing liquid in the high speed rotation rinsing liquid treatment step of step S5, and then, after the first substrate opposed plate cleaning step of step S6, the lower surface of the substrate W is treated by the rinsing liquid in the rinsing liquid-tight state step of step S7. As a result, the lower surface of the substrate W can be treated by the rinsing liquid more favorably.

Figure 5J:
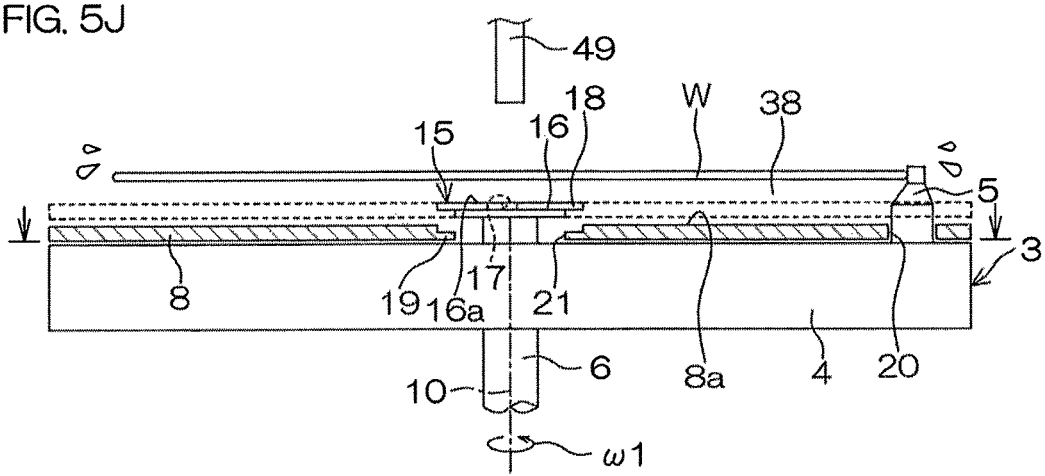
FIG. 5J is a view illustrating a step following FIG. 5I.

Then, when a predetermined time (for example, 15 sec) passes after the discharge flow rate of the rinsing liquid from the lower surface nozzle 15 is increased, the controlling device 69 closes the upper surface rinsing liquid valve 51 and the lower surface rinsing liquid valve 62, and, as shown in FIG. 5J, stops the supply of the rinsing liquid to the substrate W. Further, the controlling device 69 controls the up and down actuator 29 to lower the first substrate opposed plate 8 from the first approximate position (see FIG. 5I) to the lower position (see FIG. 5J). As a result, the first substrate opposed surface 8a of the first substrate opposed plate 8 is separated from the lower surface of the substrate W, and the liquid-tight state of the rinsing liquid between the lower surface of the substrate W and the first substrate opposed surface 8a of the first substrate opposed plate 8 is instantaneously released (S8: rinsing liquid-tight state releasing step).

Thereafter, the controlling device 69 controls the spin drive mechanism 7 to accelerate and fling the substrate W thereby to dry the substrate W (S9: drying step). The substrate W is accelerated in stages. Specifically, the controlling device 69 first accelerates the rotation of the substrate W from the rotation speed ω1 to the rotation speed ω3. Further, the controlling device 69 controls the inert gas flow rate adjusting valve 67 to increase the flow rate of the inert gas from previous 50 L/min to, for example, 100 L/min.

Then, when a predetermined time (for example, 1 sec) passes from the acceleration of the substrate W, the controlling device 69 controls the spin drive mechanism 7 to accelerate the rotation of the substrate W from the rotation speed ω4 to a further higher rotation speed ω5 (for example, 1500 rpm). Thus, the rinsing liquid adhered to the substrate W can be reliably flicked off by the rotational centrifugal force of the substrate W.

In the drying step of step S9, since a large amount of the inert gas is supplied to the space between the first substrate opposed surface 8a of the first substrate opposed plate 8 and the lower surface of the substrate W, an air flow of the inert gas can be formed in this space. As a result, while drying of the lower surface of the substrate W is facilitated, an occurrence of a watermark on the lower surface of the substrate W can be effectively suppressed.

When a predetermined time (for example, 2 sec) passes from the acceleration of the substrate W, the controlling device 69 controls the spin drive mechanism 7 to stop the rotation of the substrate W. Thereafter, the substrate transporting robot brings out the treated substrate W from the processing chamber 2 (S10: substrate bringing-out step).

As described above, according to the first embodiment, the liquid-tight state in the space 38 between the lower surface of the substrate W and the first substrate opposed surface 8a is instantaneously released by separating the lower surface of the substrate W and the first substrate opposed plate 8 in the chemical liquid-tight state releasing step of step S4. Thus, after the chemical liquid-tight state releasing step of step S4, the chemical liquid (etchant in the first embodiment) does not contact the lower surface of the substrate W, and as a result, ongoing of the chemical liquid treatment on the lower surface of the substrate W can be prevented after the chemical liquid-tight state releasing step. Thus, a treatment rate (etching rate) of the lower surface of the substrate W can be maintained at a predetermined treatment rate. Therefore, there can be provided a substrate processing method where a chemical liquid treatment can be favorably performed on the lower surface of the substrate W.

Further, in the rinsing liquid-tight state releasing step of step S8, the liquid-tight state in the space 38 between the lower surface of the substrate W and the first substrate opposed surface 8a is instantaneously released by separating the lower surface of the substrate W and the first substrate opposed plate 8. Thus, after the rinsing liquid-tight state releasing step of step S8, the rinsing liquid does not contact the lower surface of the substrate W, and as a result, ongoing of the rinsing liquid treatment on the lower surface of the substrate W can be prevented.

Figure 6:
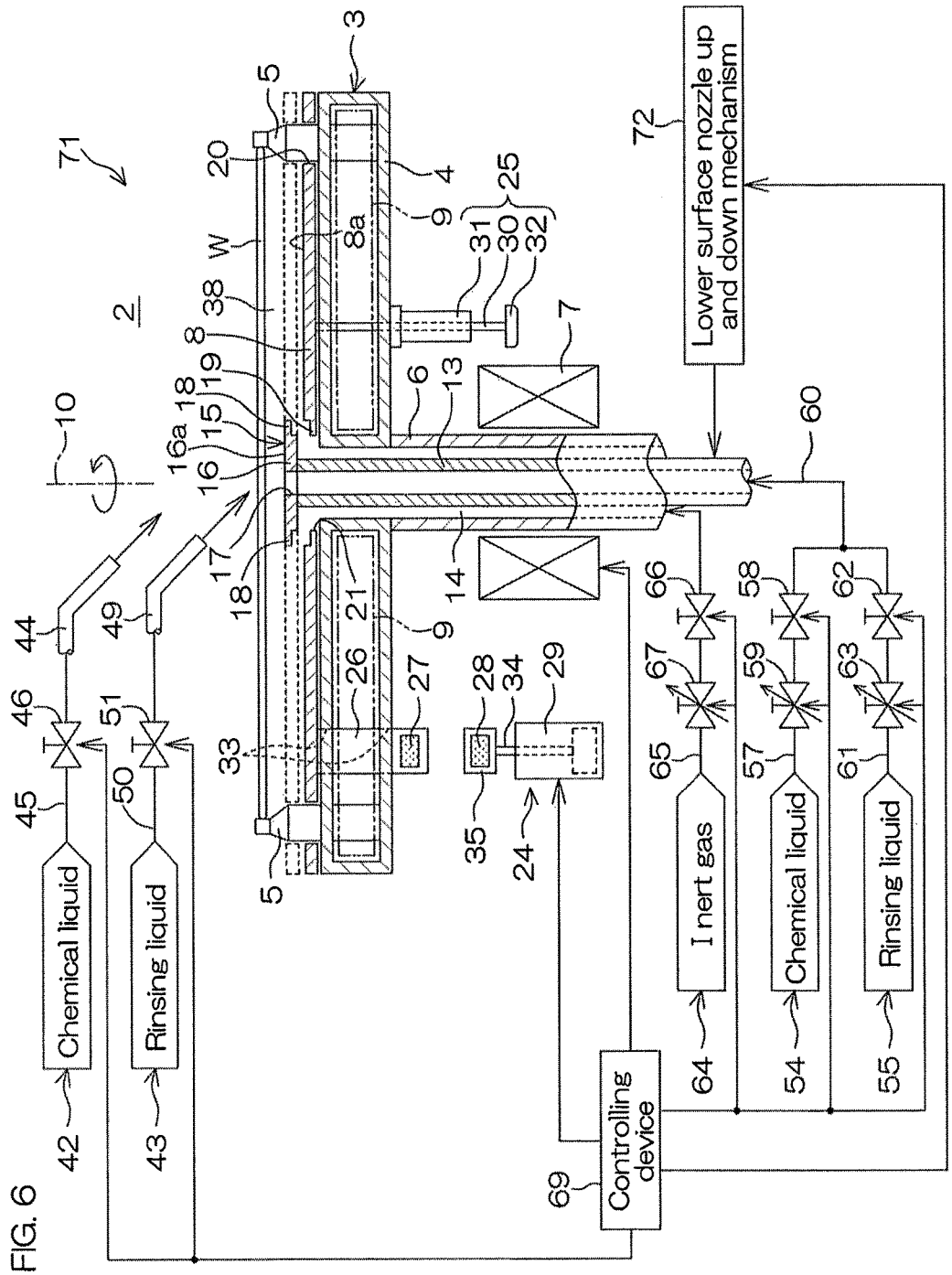
FIG. 6 shows a schematic configuration of a substrate processing apparatus according to a second embodiment of the present invention.

FIG. 6 shows a schematic configuration of a substrate processing apparatus 71 according to a second embodiment of the present invention. FIG. 7 is a plan view showing the schematic configuration 71 of the substrate processing apparatus 71 of FIG. 6. Also, FIG. 6 shows a section along a cutting line in FIG. 7 viewed in a direction of an arrow VI.

The substrate processing apparatus 71 according to the second embodiment is different from the substrate processing apparatus according to the first embodiment in that the substrate processing apparatus 71 comprises a lower surface nozzle up and down mechanism 72. With respect to other configurations, it is similar to the substrate processing apparatus 1 according to the first embodiment. In FIGS. 6, 7 and 10A to 10L, portions corresponding to the respective portions shown in the above-described first embodiment have the same reference numbers, and their descriptions are omitted.

The lower surface nozzle up and down mechanism 72 is configured, for example, by an air cylinder, and is connected to a lower end of the processing liquid supply pipe 13. When a driving force of the lower surface nozzle up and down mechanism 72 is input into the processing liquid supply pipe 13, the processing liquid supply pipe 13 goes up and down in the vertical direction, and the second substrate opposed plate 16 goes up and down integrally with it. Since the lower surface nozzle up and down mechanism 72 is provided, in the second embodiment, the second substrate opposed plate 16 can go up and down between the first approximate position and a second approximate position closer to the lower surface of the substrate W than the first approximate position (a position of the second substrate opposed plate 16 shown in FIG. 10C).

Further, in the second embodiment, the first substrate opposed plate 8 is provided in a manner capable of going up and down between the lower position near the upper surface of the spin base 4 and the second approximate position. Adjustment of such an up and down range of the first substrate opposed plate 8 can be achieved by adjusting a distance between the opposed-plate-side permanent magnet 27 and the up and down permanent magnet 28, a length of the guide shaft 30 in the guide mechanism 25, a position of the flange 32, and the like. Also, the first substrate opposed surface 8a of the first substrate opposed plate 8 in the first approximate position is flush with the second substrate opposed surface 16a of the second substrate opposed plate 16 in the first approximate position, and therefore, the first approximate position of the second substrate opposed plate 16 is considered as the same to the first approximate position of the first substrate opposed plate 8. Further, the first substrate opposed surface 8a of the first substrate opposed plate 8 in the second approximate position is flush with the second substrate opposed surface 16a of the second substrate opposed plate 16 in the second approximate position, and therefore, the second approximate position of the second substrate opposed plate 16 is considered as the same to the second approximate position of the first substrate opposed plate 8.

The substrate processing apparatus 71 comprises the controlling device 69 for controlling respective parts of this substrate processing apparatus 71. The controlling device 69 is configured to control the spin drive mechanism 7, the substrate-holding-member movable mechanism 9, the up and down actuator 29, the lower surface nozzle up and down mechanism 72, and the like. Further, the substrate processing apparatus 71 controls opening and closing of the upper surface chemical liquid valve 46, the upper surface rinsing liquid valve 51, the lower surface chemical liquid valve 58, the lower surface rinsing liquid valve 62, the inert gas valve 66 and the like, and controls opening amounts of the chemical liquid flow rate adjusting valve 59, the rinsing liquid flow rate adjusting valve 63, the inert gas flow rate adjusting valve 67 and the like.

FIG. 8 is a flow chart showing a process example of the substrate processing apparatus 71. FIG. 9 is a time chart showing the process example of the substrate processing apparatus 71. FIGS. 10A to 10L are views illustrating the process example in FIGS. 8 and 9. Referring to FIGS. 6, 8, 9 and 10A to 10L, the process example of the substrate processing apparatus 71 is described.

Figure 10A:
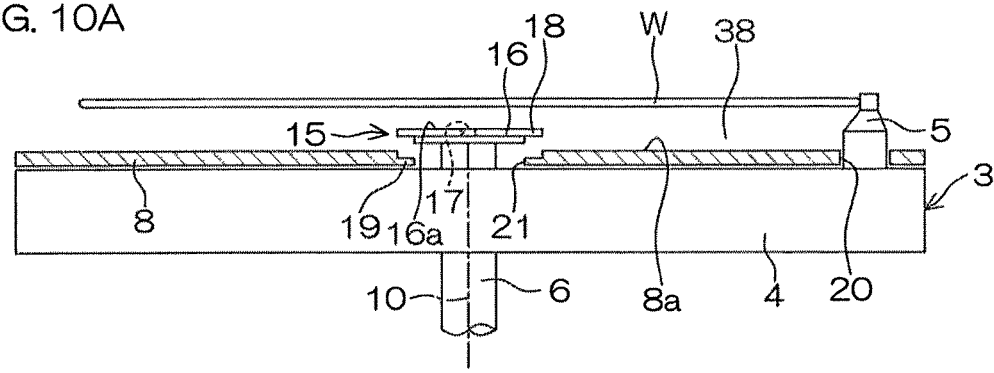
FIGS. 10A to 10C are views illustrating the process example in FIGS. 8 and 9.

In the process example of FIG. 8, an untreated substrate W is first brought into the processing chamber 2 by the substrate transporting robot not shown, and as shown in FIG. 10A, the substrate W is held by the spin chuck 3 with a device formation surface of the substrate W faced upward (S1: substrate bringing-in step). When the substrate W is transported, the first substrate opposed plate 8 is arranged in the lower position, as shown in FIG. 10A. Further, the second substrate opposed plate 16 is in the first approximate position.

Figure 10B:
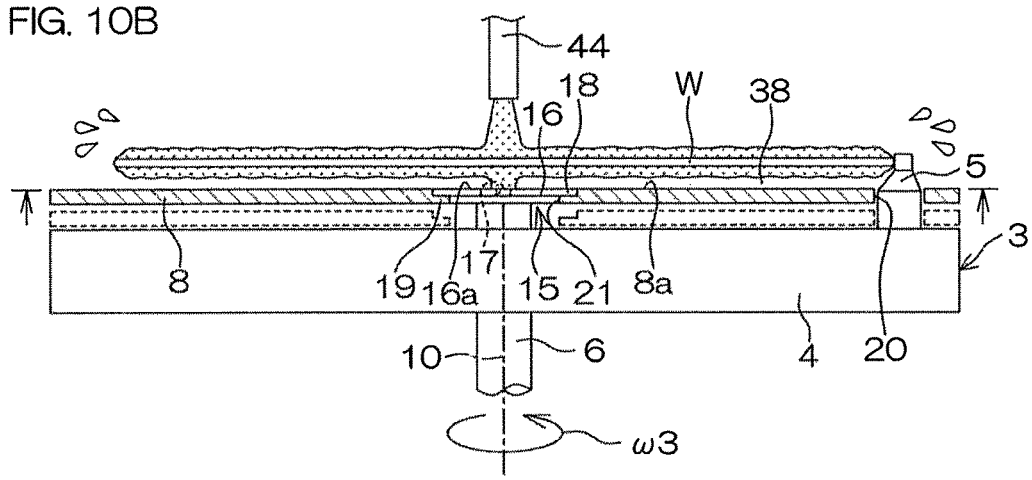

Then, as shown in FIG. 10B, the controlling device 69 controls the spin drive mechanism 7 to rotate the substrate W from the resting state at a high speed of the rotation speed $\omega 3$ (for example, 500 rpm) around the rotation axis line 10, and at the same time, controls the up and down actuator 29 to raise the first substrate opposed plate 8 from the lower position (see FIG. 10A) to the first approximate position (see FIG. 10B). At this time, the first substrate opposed surface 8a of the first substrate opposed plate 8 is set flush with the second substrate opposed surface 16a of the second substrate opposed plate 16.

Further, the controlling device 69 opens the upper surface chemical liquid valve 46 to supply the chemical liquid to the upper surface of the substrate W, and at the same time, opens the lower surface chemical liquid valve 58 to supply the chemical liquid to the lower surface of the substrate W (S12: high speed rotation chemical liquid treatment step). At this time, the discharge flow rates of the chemical liquid discharged from the upper surface chemical liquid nozzle 44 and the lower surface nozzle 15 are respectively 1.0 L/min, for example.

In the high speed rotation chemical liquid treatment step of step S12, the chemical liquid discharged from the upper surface chemical liquid nozzle 44 contacts the center portion of the upper surface of the substrate W, and then spreads to the peripheral edge portion of the upper surface of the substrate W by the rotational centrifugal force of the substrate W. Thus, the entire upper surface of the substrate W is treated by the chemical liquid. Further, the chemical liquid discharged from the lower surface nozzle 15 contacts the center portion of the lower surface of the substrate W, and then spreads along the lower surface of the substrate W to the peripheral edge portion of the lower surface by the rotational centrifugal force of the substrate W. Thus, the entire lower surface of the substrate W is treated by the chemical liquid.

Figure 10C:
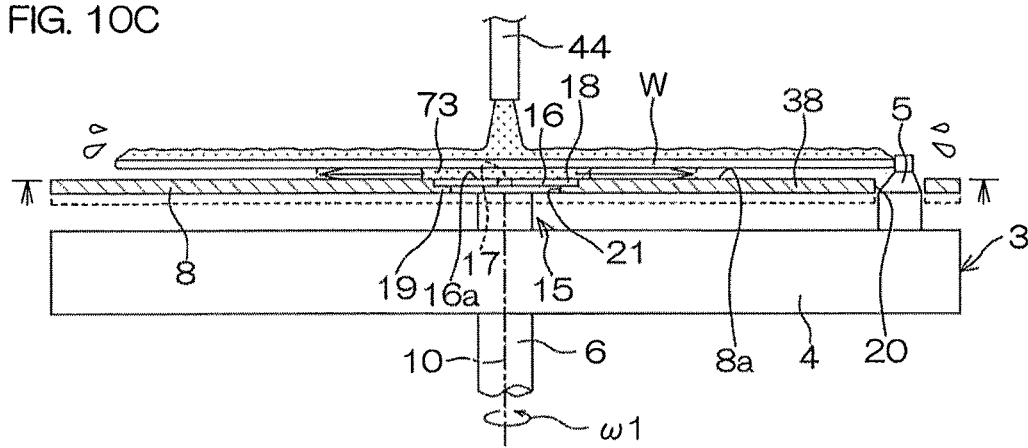

When a predetermined time (for example, 5 sec) passes from a start of discharge of the chemical liquid, the controlling device 69 controls the spin drive mechanism 7 to decelerate the rotation of the substrate W from the rotation speed $\omega 3$ to the lower rotation speed $\omega 1$ (for example, 10 rpm), as shown in FIG. 10C. Further, the controlling device 69 controls the lower surface nozzle up and down mechanism 72 to raise the second substrate opposed plate 16 from the first approximate position (see FIG. 10B) to the second approximate position (see FIG. 10C). Further, the controlling device 69 controls the up and down actuator 29 to raise the first substrate opposed plate 8 from the lower position (see FIG. 10B) to the second approximate position (see FIG. 10C) approximating the lower surface of the substrate W. Thus, the chemical liquid is cause to be in a liquid-tight state in the space 38 between the lower surface of the substrate W and the first substrate opposed surface 8a in the first approximate position. The lower surface of the substrate W is treated by the chemical liquid in the liquid-tight state (S13: chemical liquid-tight state step).

Specifically, in the chemical liquid-tight state step of step S13, when the first substrate opposed plate 8 and the second substrate opposed plate 16 reach the second approximate position, the first substrate opposed surface 8a of the first substrate opposed plate 8 and the second substrate opposed surface 16a of the lower surface nozzle 15 are arranged on the same plane. Further, while the first substrate opposed plate 8 is arranged in the second approximate position, an outwardly cylindrical liquid column 73 of the chemical liquid is formed between the lower surface of the substrate W and the second substrate opposed surface 16a of the second substrate opposed plate 16 by the deceleration of the substrate W.

It is desirable that the discharge flow rate of the chemical liquid is small to maintain the liquid column 73 of the chemical liquid. However, a predetermined amount of the chemical liquid is required at formation of the liquid column 73 of the chemical liquid. In this process example, since the chemical liquid at a relatively large flow rate is supplied to the lower surface of the substrate W in the high speed rotation chemical liquid treatment step of step S12, a relatively large amount of the chemical liquid exists on the lower surface of the substrate W at a start of the chemical liquid-tight state step of S13. Therefore, the liquid column 73 of the chemical liquid can be favorably formed.

Figure 10D:
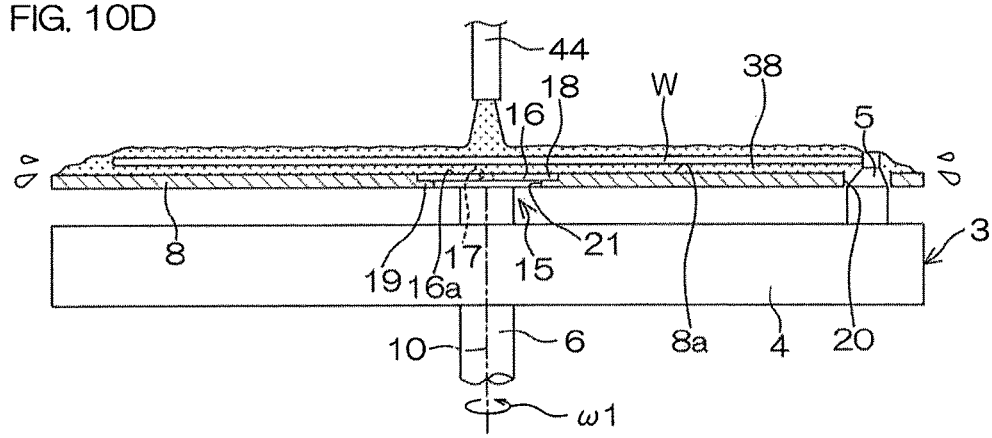
FIGS. 10D to 10F are views illustrating a step following FIG. 10C.

Further, the liquid column 73 of the chemical liquid is expanded in the circumferential direction of the substrate W by further supplying the chemical liquid to the liquid column 73 of the chemical liquid. The liquid column 73 of the chemical liquid between the lower surface of the substrate W and the second substrate opposed surface 16a of the second substrate opposed plate 16 expands along between the lower surface of the substrate W and the first substrate opposed surface 8a of the first substrate opposed plate 8 in the space 38 between the lower surface of the substrate W and the first substrate opposed surface 8a toward the peripheral edge portion of the substrate W (see arrows in FIG. 10C). Thus, the chemical liquid reaches the liquid-tight state in the entire space 38, as shown in FIG. 10D. Since the liquid-tight state in the entire space 38 can be achieved by a small flow rate of the chemical liquid, a consumption of the chemical liquid can be reduced.

Further, since the insertion recess 20 for making each holding member 5 inserted through is formed in the first substrate opposed plate 8, the holding member 5 and the first substrate opposed plate 8 do not contact when the first substrate opposed plate 8 is raised from the lower position to the second approximate position. Thus, the first substrate opposed plate 8 can go favorably up and down.

Figure 10E:
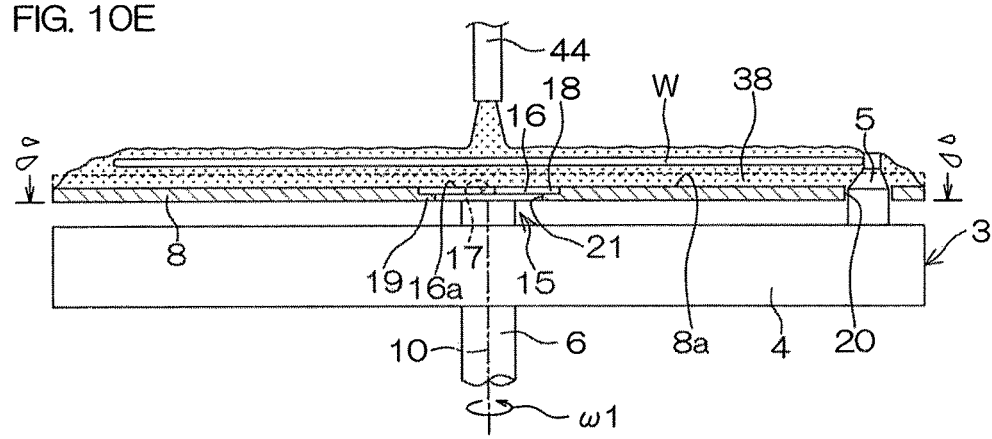

Then, when a predetermined time (for example, 5 sec) passes after the second substrate opposed plate 16 is arranged in the second approximate position, the controlling device 69 controls to the up and down actuator 29 and the lower surface nozzle up and down mechanism 72 and, as shown in FIG. 10E, integrally lowers the first substrate opposed plate 8 and the second substrate opposed plate 16 from the second approximate position (see FIG. 10D) to the first approximate position (see FIG. 10E). The first substrate opposed plate 8 and the second substrate opposed plate 16 are lowered from the second approximate position to the first approximate position while maintained in the liquid-tight state.

At this time, as shown in FIG. 10E, the peripheral edge portion of the first substrate opposed plate 8 overhangs outwardly from each insertion recess 20, and a thick portion is provided between each insertion recess 20 and the outer peripheral end of the first substrate opposed plate 8. This thick portion makes it possible that in the chemical liquid-tight state step of step S13, the peripheral edge portion of the substrate W including a portion held by the holding members 5 is also caused to be in the liquid-tight state. In this state, since the chemical liquid contacts the entire lower surface of the substrate W, the entire lower surface of the substrate W can be favorably and uniformly treated by the chemical liquid. Further, since the chemical liquid treatment to the upper surface of the substrate W and the chemical liquid treatment to the lower surface of the substrate W are performed at the same time, a treatment time can be decreased compared to a case where the upper and lower surfaces of the substrate W are individually subjected to the chemical liquid treatment.

Thus, when the substrate W is treated by the chemical liquid, the lower surface of the substrate W is treated by the chemical liquid in the high speed rotation chemical liquid treatment step of step S12, and then the lower surface of the substrate W is treated by the chemical liquid in the chemical liquid-tight state step of step S13. Therefore, the lower surface of the substrate W can be treated by the chemical liquid more favorably.

Figure 10F:
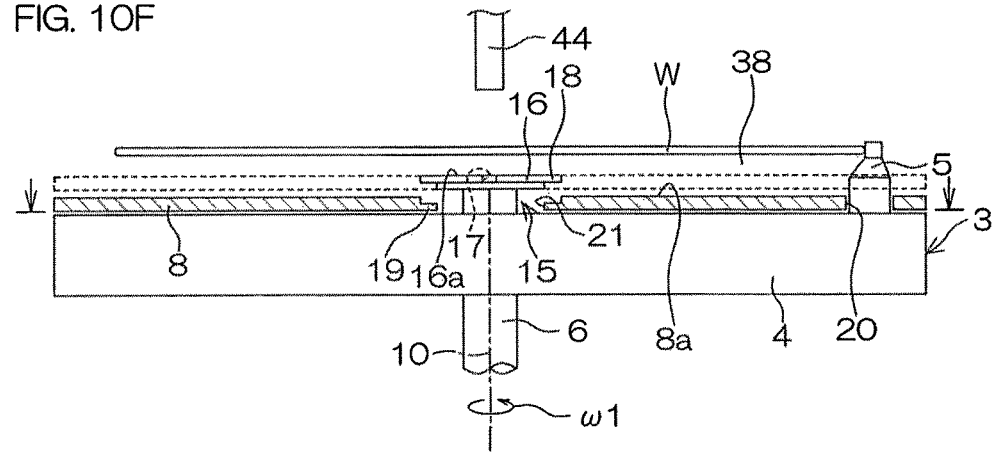

Then, when a predetermined time (for example, 20 sec) passes in the first approximate position, the controlling device 69 closes the upper surface chemical liquid valve 46 and the lower surface chemical liquid valve 58, and, as shown in FIG. 10F, stops the supply of the chemical liquid to the substrate W. Further, the controlling device 69 controls the up and down actuator 29 to lower the first substrate opposed plate 8 from the first approximate position (see FIG. 10E) to the lower position (see FIG. 10F). As a result, the first substrate opposed surface 8a of the first substrate opposed plate 8 is separated from the lower surface of the substrate W, and the liquid-tight state of the chemical liquid between the lower surface of the substrate W and the first substrate opposed surface 8a of the first substrate opposed plate 8 is instantaneously released (S14: chemical liquid-tight state releasing step).

Further, the controlling device 69 controls the spin drive mechanism 7 to accelerate the rotation of the substrate W from the rotation speed ω1 to the rotation speed ω3. Further, the controlling device 69 opens the upper surface rinsing liquid valve 51 to supply the rinsing liquid to the upper surface of the substrate W, and at the same time, opens the lower surface rinsing liquid valve 62 (see FIG. 6) to supply the rinsing liquid to the lower surface of the substrate W (S15: high speed rotation rinsing liquid treatment step). Flow rates of the rinsing liquid discharged from the upper surface rinsing liquid nozzle 49 and the lower surface nozzle 15 are respectively, for example, 4.0 L/min. Further, the controlling device 69 opens the inert gas valve 66 (see FIG. 6) to supply the inert gas to the space 38 between the lower surface of the substrate W and the first substrate opposed surface 8a. A discharge flow rate of the inert gas is, for example, 50 L/min.

In the high speed rotation rinsing liquid treatment step of step S15, the rinsing liquid discharged from the upper surface rinsing liquid nozzle 49 contacts the center portion of the upper surface of the substrate W, and then spreads to the peripheral edge portion of the upper surface of the substrate W by the rotational centrifugal force of the substrate W. Thus, the chemical liquid adhering to the upper surface of the substrate W is washed out by the rinsing liquid on the entire upper surface of the substrate W. Further, the inert gas discharged from the vertical upper end of the inert gas supply pipe 14 passes the lower portion of the flange 18 of the second substrate opposed plate 16 and is blown out radially around the rotation axis line 10. This inert gas passes the space between the lower surface of the substrate W and the first substrate opposed surface 8a of the first substrate opposed plate 8 to be ejected to outside the rotation range of the substrate W. Thus, it can be prevented that the rinsing liquid and a liquid drop of the chemical liquid washed out by the rinsing liquid enter the inert gas supply pipe 14 and the processing liquid dispense port 17 of the lower surface nozzle 15.

Figure 10G:
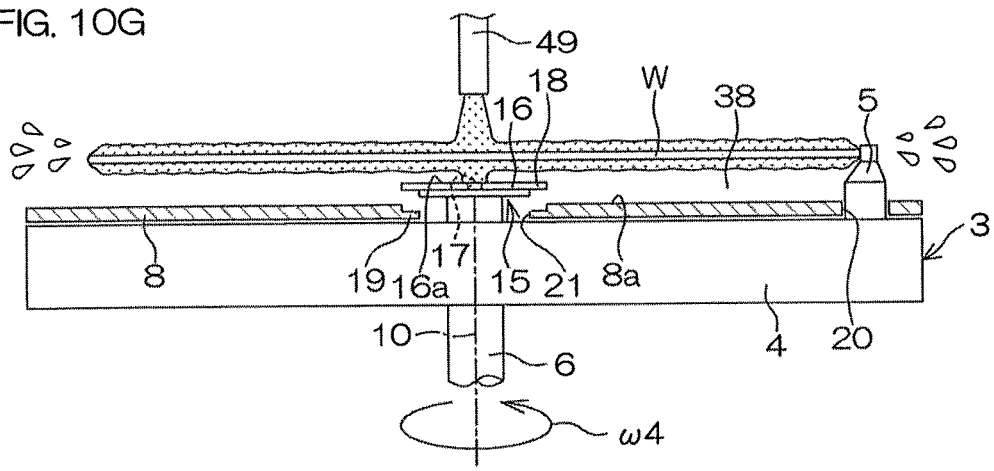
FIGS. 10G to 10I are views illustrating a step following FIG. 10F.

When a predetermined time (for example, 1 sec) passes from a start of discharge of the rinsing liquid, the controlling device 69 controls the spin drive mechanism 7 to accelerate the rotation of the substrate W from the rotation speed $\omega 3$ to the further higher rotation speed $\omega 4$ (for example, 1000 rpm), as shown in FIG. 10G. Thus, the rinsing liquid discharged from the lower surface nozzle 15 contacts the center portion of the lower surface of the substrate W, and then spreads to the peripheral edge portion of the lower surface of the substrate W along the lower surface of the substrate W by the rotational centrifugal force of the substrate W. Thus, the chemical liquid adhering to the lower surface of the substrate W is washed out by the rinsing liquid on the entire lower surface of the substrate W. Further, in this state, since the rinsing liquid discharged from the upper surface rinsing liquid nozzle 49 is also kept being supplied to the entire upper surface of the substrate W, a rinsing treatment is favorably performed on the entire upper and lower surfaces of the substrate W.

Figure 10H:
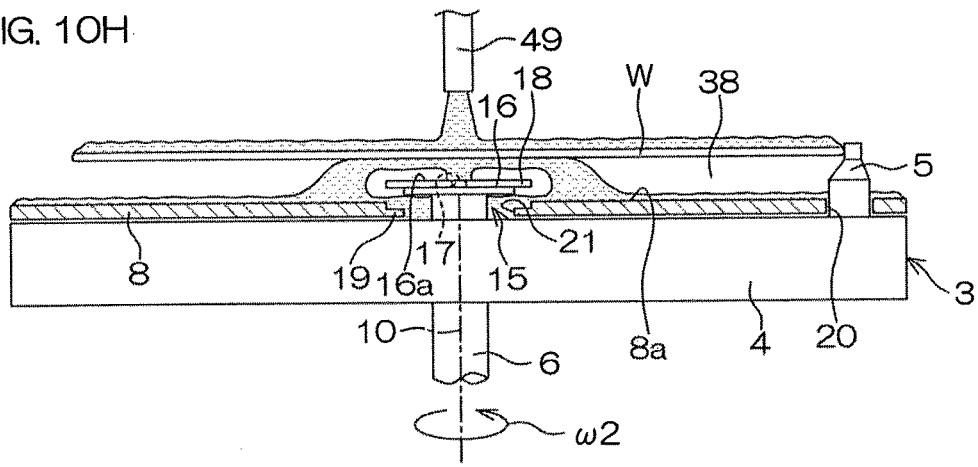

Then, when a predetermined time (for example, 10 sec) passes from the acceleration of the substrate W, the controlling device 69 controls the spin drive mechanism 7 to decelerate the rotation of the substrate W to the rotation speed $\omega 2$ (for example, 100 rpm) which is lower than the rotation speed $\omega 3$ but higher than the rotation speed $\omega 1$, as shown in FIG. 10H. Further, the controlling device 69 controls the rinsing liquid flow rate adjusting valve 63 to decrease the discharge flow rate of the rinsing liquid from the lower surface nozzle 15, for example, from 4.0 L/min to 1.0 L/min.

At this time, the rinsing liquid supplied to the center portion of the lower surface of the substrate W spreads to the peripheral edge portion on the lower surface of the substrate W, then falls downwardly by the gravity, is supplied to the first substrate opposed surface 8a of the first substrate opposed plate 8, and flows along the first substrate opposed surface 8a of the first substrate opposed plate 8. The entire outer surface of the first substrate opposed plate 8 including the first substrate opposed surface 8a is cleaned by the rinsing liquid flowing on the first substrate opposed surface 8a (S16: first substrate opposed plate cleaning step).

Figure 10I:
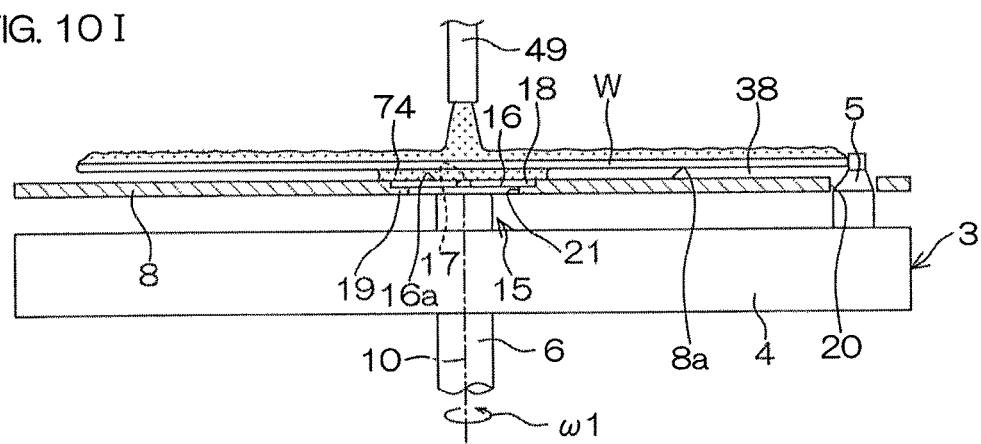
Figure 10J:
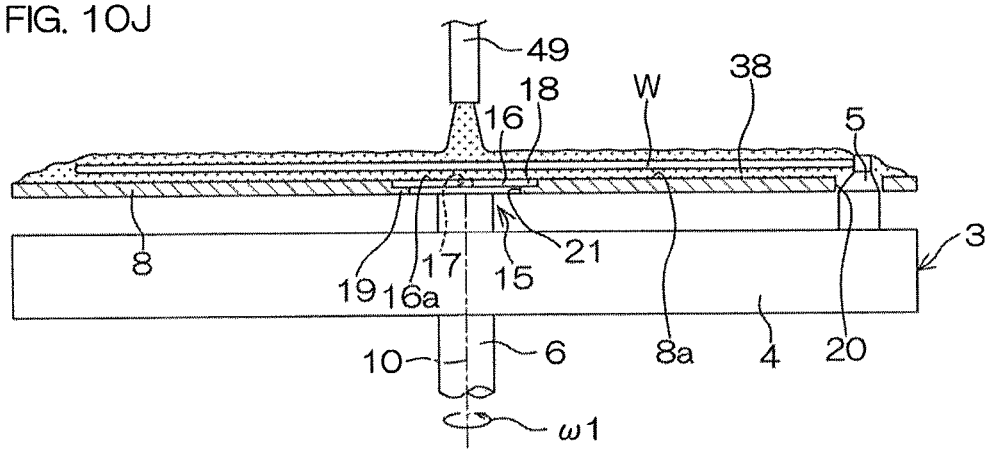
FIGS. 10J to 10L are views illustrating a step following FIG. 10I.

Then, when a predetermined time (for example, 5 sec) passes from the deceleration of the substrate W, the controlling device 69 controls the spin drive mechanism 7 to decelerate the rotation of the substrate W from the rotation speed $\omega 2$ to the rotation speed $\omega 1$, as shown in FIG. 10I. Further, the controlling device 69 controls the lower surface nozzle up and down mechanism 72 to raise the second substrate opposed plate 16 from the first approximate position (see FIG. 10H) to the second approximate position (see FIG. 10I). Further, the controlling device 69 controls the up and down actuator 29 to raise the first substrate opposed plate 8 from the lower position (see FIG. 10H) to the second approximate position (see FIG. 10I). Thus, the rinsing liquid is caused to be in a liquid-tight state in the space 38 between the lower surface of the substrate W and the first substrate opposed surface 8a in the second approximate position. The lower surface of the substrate W is treated by the rinsing liquid in the liquid-tight state (S17: rinsing liquid-tight state step).

Specifically, in the rinsing liquid-tight state step of step S17, when the first substrate opposed plate 8 and the second substrate opposed plate 16 reach the second approximate position, the first substrate opposed surface 8a of the first substrate opposed plate 8 and the second substrate opposed surface 16a of the lower surface nozzle 15 are arranged on the same plane. Further, with the first substrate opposed plate 8 positioned in the first approximate position, an outwardly cylindrical liquid column 74 of the rinsing liquid is formed between the lower surface of the substrate W and the second substrate opposed surface 16a of the second substrate opposed plate 16 by the deceleration of the substrate W.

It is desirable to maintain the liquid column 74 of the rinsing liquid that the discharge flow rate of the rinsing liquid is small. However, a predetermined amount of the rinsing liquid is required when the liquid column 74 of the rinsing liquid is formed. In this process example, a relatively large amount of the rinsing liquid is supplied to the lower surface of the substrate W in the high speed rotation rinsing liquid treatment step of step S15. Thus, a relatively large amount of the rinsing liquid exists on the lower surface of the substrate W at a start of the rinsing liquid-tight state step of step S17. Therefore, the liquid column 74 of the rinsing liquid can be favorably formed.

Further, the liquid column 74 of the rinsing liquid is expanded in the circumferential direction of the substrate W by further supplying the rinsing liquid to the liquid column 74 of the rinsing liquid. The liquid column 74 of the rinsing liquid between the lower surface of the substrate W and the second substrate opposed surface 16a of the second substrate opposed plate 16 expands along between the lower surface of the substrate W and the first substrate opposed surface 8a of the first substrate opposed plate 8 in the space 38 between the lower surface of the substrate W and the first substrate opposed surface 8a toward the peripheral edge portion of the substrate W (see arrows in FIG. 10I). Thus, the rinsing liquid reaches the liquid-tight state in the entire space 38, as shown in in FIG. 10J. Since the liquid-tight state in this space 38 can be achieved by a small flow rate of the rinsing liquid, a consumption of the rinsing liquid can be reduced.

Figure 10K:
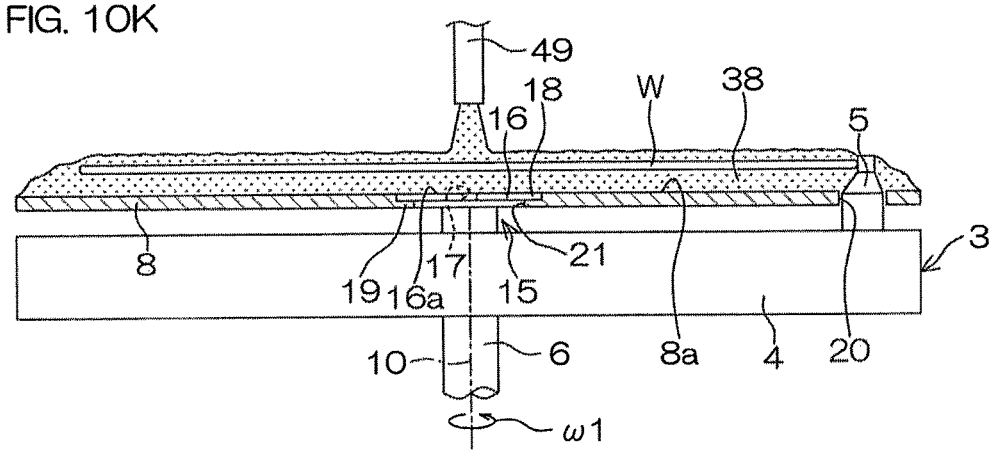

Then, when a predetermined time (for example, 5 sec) passes in the second approximate position, the controlling device 69 controls to the up and down actuator 29 and the lower surface nozzle up and down mechanism 72 and, as shown in FIG. 10K, integrally lowers the first substrate opposed plate 8 and the second substrate opposed plate 16 from the second approximate position (see FIG. 10J) to the first approximate position (see FIG. 10K). The first substrate opposed plate 8 and the second substrate opposed plate 16 are lowered from the second approximate position to the first approximate position while maintained in the liquid-tight state.

At this time, as shown in FIG. 10K, the peripheral edge portion of the first substrate opposed plate 8 overhangs outwardly from each insertion recess 20, and a thick portion is provided between each insertion recess 20 and the outer peripheral end of the first substrate opposed plate 8. This thick portion makes it possible that in the rinsing liquid-tight state step of step S17, the peripheral edge portion of the substrate W including a portion held by the holding members 5 is also caused to be in the liquid-tight state. As a result, the liquid-tight state by the rinsing can be reliably and favorably achieved on the entire lower surface of the substrate W. Further, since the rinsing liquid treatment to the upper surface of the substrate W and the rinsing liquid treatment to the lower surface of the substrate W are performed at the same time, a treatment time can be decreased compared to a case where the upper and lower surfaces of the substrate W are individually subjected to the rinsing liquid treatment.

Thus, when the substrate W is treated by the rinsing liquid, the lower surface of the substrate W is treated by the rinsing liquid in the high speed rotation rinsing liquid treatment step of step S15, and then, after the first substrate opposed plate cleaning step of step S16, the lower surface of the substrate W is treated by the rinsing liquid in the rinsing liquid-tight state step of step S17. Therefore, the lower surface of the substrate W can be treated by the rinsing liquid more favorably.

Figure 10L:
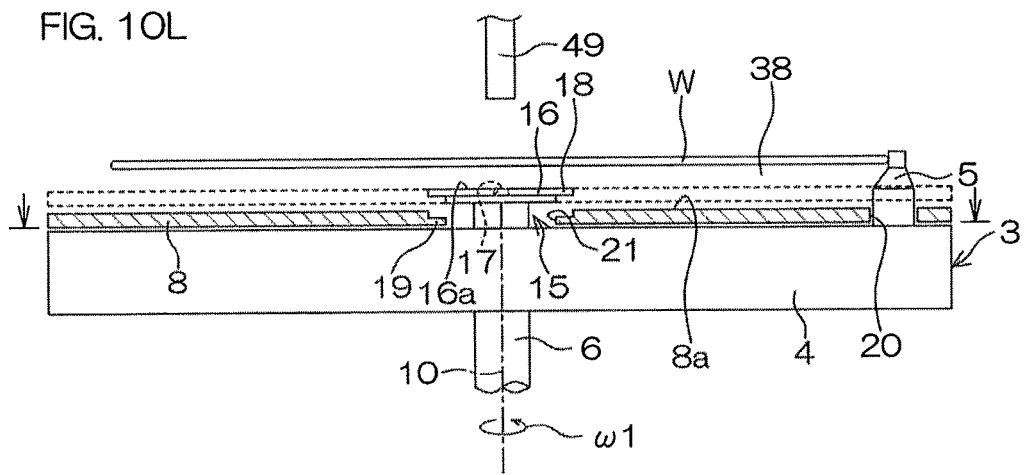

Then, when a predetermined time (for example, 15 sec) passes in the first approximate position, the controlling device 69 closes the upper surface rinsing liquid valve 51 and the lower surface rinsing liquid valve 62, and, as shown in FIG. 10L, stops the supply of the rinsing liquid to the substrate W. Further, the controlling device 69 controls the up and down actuator 29 to lower the first substrate opposed plate 8 from the first approximate position (see FIG. 10K) to the lower position (see FIG. 10L). As a result, the first substrate opposed surface 8a of the first substrate opposed plate 8 is separated from the lower surface of the substrate W, and the liquid-tight state of the rinsing liquid between the lower surface of the substrate W and the first substrate opposed surface 8a of the first substrate opposed plate 8 is instantaneously released (S18: rinsing liquid-tight state releasing step).

Thereafter, the controlling device 69 controls the spin drive mechanism 7 to accelerate and fling the substrate W thereby to dry the substrate W (S19: drying step). The substrate W is accelerated in stages. Specifically, the controlling device 69 first accelerates the rotation of the substrate W from the rotation speed $\omega 1$ to the rotation speed $\omega 3$. Further, the controlling device 69 controls the inert gas flow rate adjusting valve 67 to increase the flow rate of the inert gas from previous 50 L/min to, for example, 100 L/min.

Then, when a predetermined time (for example, 1 sec) passes from the acceleration of the substrate W, the controlling device 69 controls the spin drive mechanism 7 to accelerate the rotation of the substrate W from the rotation speed $\omega 4$ to a further higher rotation speed $\omega 5$ (for example, 1500 rpm). Thus, the rinsing liquid adhered to the substrate W can be reliably flicked off by the rotational centrifugal force of the substrate W.

In the drying step of step S19, since a large amount of the inert gas is supplied to the space between the first substrate opposed surface 8a of the first substrate opposed plate 8 and the lower surface of the substrate W, an air flow of the inert gas can be formed in this space. As a result, while drying of the lower surface of the substrate W is facilitated, an occurrence of a watermark on the lower surface of the substrate W can be effectively suppressed.

When a predetermined time (for example, 2 sec) passes from the acceleration of the substrate W, the controlling device 69 controls the spin drive mechanism 7 to stop the rotation of the substrate W. Thereafter, the substrate transporting robot brings out the treated substrate W from the processing chamber 2 (S20: substrate bringing-out step).

As described above, the substrate processing method of the second embodiment can also achieve functions and effects similar to the functions and effects described with respect to the above-described substrate processing method of the first embodiment.

While the embodiments of the present invention are described, the present invention can be implemented also in other modes.

For example, in the above-described embodiments, the first substrate opposed plate 8 having the first substrate opposed surface 8a is described. However, in place of the first substrate opposed plate 8, configuration examples of first substrate opposed plates 81, 82, 83 shown in FIGS. 11A to 11C may be employed.

Figure 11A:
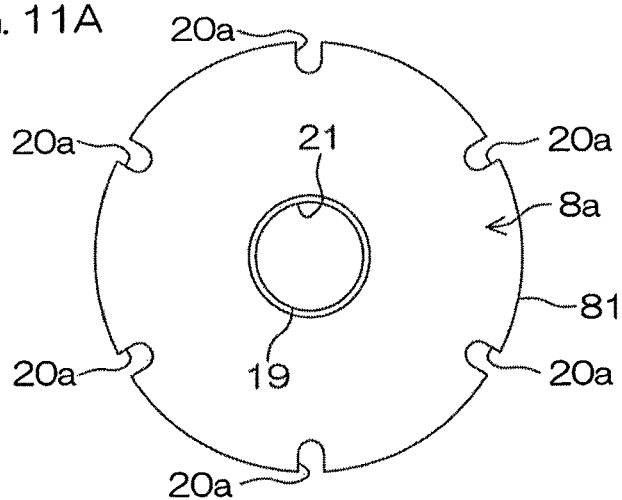
FIGS. 11A to 11C are plan views showing another configuration example of a first substrate opposed plate.
Figure 11B:
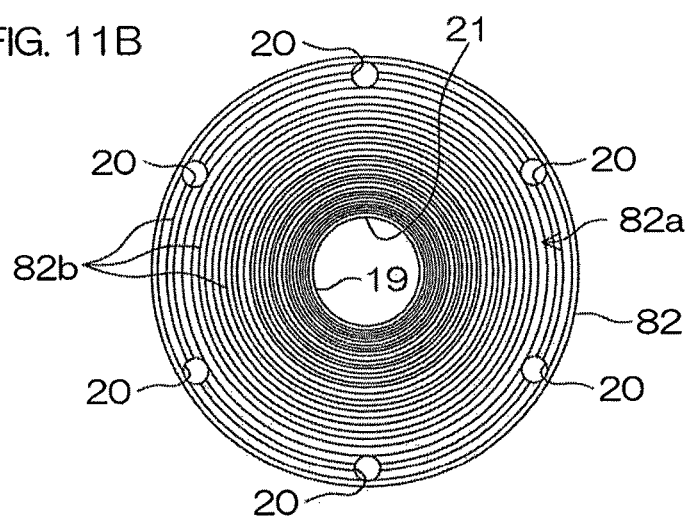
Figure 11C:
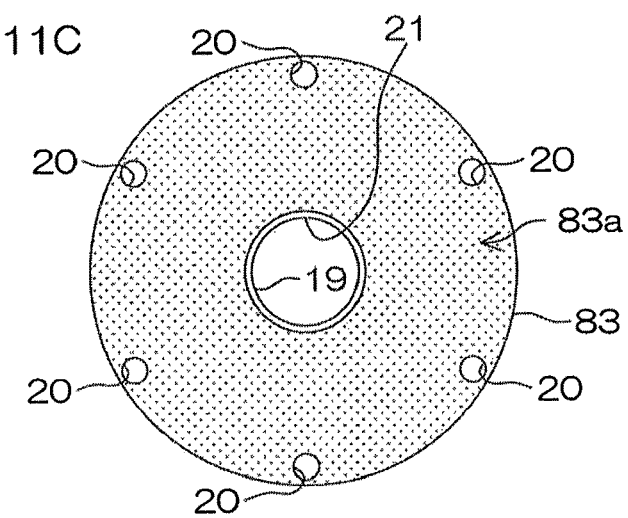

FIGS. 11A to 11C are plan views showing other configuration examples of a first substrate opposed plate.

FIG. 11A shows the first substrate opposed plate 81. The first substrate opposed plate 81 is different from the first substrate opposed plate 8 in that in place of the insertion hole of the insertion recess 20, a notch portion 20a is formed as an insertion recess 20. The notch portion 20a is formed in a position corresponding to the holding member 5, similarly to the above-described first and second embodiments. Since the notch portion 20a is formed in a recessed shape from the peripheral end of the substrate W toward the rotation axis line 10, the thick portion is not provided between the insertion recess 20 and the peripheral end of the substrate W, differently from the above-described embodiments.

Functions and effects generally similar to the functions and effects described in the above-described embodiments can also be obtained by such a configuration. However, in the case, an insertion hole is preferably formed as an insertion recess 20 where a thick portion is formed, like in the above-described embodiments.

Further, FIG. 11B shows the first substrate opposed plate 82. The first substrate opposed plate 82 is different from the first substrate opposed plate 8 in that a first substrate opposed surface 82a of the first substrate opposed plate 82 includes a hydrophilic surface.

The first substrate opposed surface 82a is provided with a plurality of notches 82b in a concentric manner viewed from an opening 21 of the first substrate opposed plate 82. These plurality of notches 82b form a number of recessed portions on the first substrate opposed surface 82a of the first substrate opposed plate 82. This makes the first substrate opposed surface 82a have the hydrophilic surface.

Thus, when the first substrate opposed surface 82a has the hydrophilic surface, in the chemical liquid-tight state step of step S3, S13, distances between the lower surface of the substrate W and the first substrate opposed surface 82a is partially decreased and increased by the recessed portions formed by the plurality of notches 82b. This can improve wettability of the chemical liquid supplied to the space 38 between the lower surface of the substrate W and the first substrate opposed surface 82a. As a result, it is easier to cause the space 38 between the lower surface of the substrate W and the first substrate opposed surface 8a to be in a liquid-tight state by the chemical liquid. Further, also in the rinsing liquid-tight state step S7, S17, wettability of the rinsing liquid supplied to the space 38 between the lower surface of the substrate W and the first substrate opposed surface 82a can be improved similarly. As a result, it is easier to cause the space 38 between the lower surface of the substrate W and the first substrate opposed surface 82a to be in a liquid-tight state by the rinsing liquid.

Further, the first substrate opposed plate 83 shown in FIG. 11C has a first substrate opposed surface 83a including a hydrophilic surface, similar to the above-described first substrate opposed plate 82 in FIG. 11B. The first substrate opposed plate 83 shown in FIG. 11C is different from the first substrate opposed plate 82 in that the first substrate opposed surface 83a has a predetermined surface roughness. Thus, the first substrate opposed surface 83a having the predetermined surface roughness can provide a function and effect similar to those described with respect to FIG. 11B.

Further, the first substrate opposed plates 81, 82, 83 shown in FIGS. 11A to 11C may be used in combination with the configurations of the first substrate opposed plate 8 in the above-described embodiments. Further, other than the above-described first substrate opposed plates 81, 82, 83 shown in FIGS. 11A to 11C, a bowl-shaped first substrate opposed plate having a smooth first substrate opposed surface in a shape of a recessed surface may be employed. In such a configuration, it is easy to form a liquid pool, and thus, it is easy to cause the space 38 between the lower surface of the substrate W and the first substrate opposed surface 8a to be in a liquid-tight state.

Further, while in each of the above-described embodiments, the examples of the guide mechanism 25 making the first substrate opposed plate 8 go up and down by the magnetic force are shown, a mechanism which inputs the driving force of the up and down actuator 29 into the first substrate opposed plate 8 may be employed.

Further, while each of the above-described embodiments does not show a chemical liquid temperature of the chemical liquid supplied to the upper surface of the substrate W and the lower surface of the substrate W, a chemical liquid (etchant) heated to a high temperature may be supplied to the upper surface of the substrate W and the lower surface of the substrate W.

When the chemical liquid is heated to a high temperature, the chemical liquid is at the high temperature immediately after being supplied to the upper surface of the substrate W. However, its liquid temperature lowers while flowing to the peripheral edge portion of the substrate W. Therefore, the temperature of the chemical liquid is relatively high on the center portion of the substrate W, and the temperature of the chemical liquid is relatively low on the peripheral edge portion of the substrate W. As a result, uneven treatment rates (etching rates) on the upper surface of the substrate W may be caused in such a manner that the center portion of the surface of the substrate W is treated by the chemical liquid relatively speedily while the peripheral edge portion of the upper surface of the substrate W is treated by the chemical liquid relatively slowly.

However, according to each of the above-described embodiments, as shown in the chemical liquid-tight state step of step S3, S13 (see FIGS. 5D, 10E and the like), the liquid-tight state by the chemical liquid is formed in the space 38 between the lower surface of the substrate W and the first substrate opposed surface 8a. Therefore, when the chemical liquid supplied to the lower surface of the substrate W is also heated to a high temperature, the chemical liquid of the high temperature can contact the entire lower surface of the substrate W. As a result, the substrate W can have a high and even temperature distribution. Thus, even when the chemical liquid of the high temperature is supplied to the upper surface of the substrate W, it can be prevented that the temperature of the supplied chemical liquid lowers on the peripheral edge portion of the lower surface of the substrate W. As a result, the upper surface of the substrate W can be treated at an even treatment rate (etching rate).

Further, with respect to the above-described second embodiment, the example where the second substrate opposed plate 16 goes up and down between the first approximate position and the second approximate position. However, the second substrate opposed plate 16 may go up and down between the lower position and the second approximate position.

In this case, in the chemical liquid-tight state releasing step of above-described step S14 (see FIGS. 10E and 10F), the controlling device 69 controls the up and down actuator 29 and the lower surface nozzle up and down mechanism 72 to lower the first substrate opposed plate 8 and the second substrate opposed plate 16 from the first approximate position to the lower position at the same time. As a result, the first substrate opposed surface 8a of the first substrate opposed plate 8 and the second substrate opposed surface 16a of the second substrate opposed plate 16 are separated from the lower surface of the substrate W, and not only the liquid-tight state of the chemical liquid between the lower surface of the substrate W and the first substrate opposed surface 8a of the first substrate opposed plate 8 can be instantaneously released, but also the liquid-tight state of the chemical liquid on the second substrate opposed surface 16a of the second substrate opposed plate 16 can be instantaneously released. Further, a similar function and effect can also be obtained in the rinsing liquid-tight state releasing step of step S18 (see FIGS. 10K and 10L).

Further, each of the above-described embodiments describes the case where the substrate processing apparatus 1, 71 is the device processing a disk-shaped substrate W. However, the substrate processing apparatus 1, 71 may be a device processing a polygonal substrate such as a substrate for a liquid crystal display.

While the embodiments of the present invention are described in detail, they are only specific examples used for clarifying technical contents of the present invention. The present invention should not be limited to these specific examples, and the scope of the present invention is only limited by the appended claims.

The present application corresponds to Japanese Patent Application No. 2013-170612, the entire disclosure of which is incorporated herein by reference.

LIST OF REFERENCE NUMERALS 1 substrate processing apparatus
3 spin chuck
4 spin base
5 holding member
6 rotation shaft
8 first substrate opposed plate
8a first substrate opposed surface
10 rotation axis line
15 lower surface nozzle
16 second substrate opposed plate
16a second substrate opposed surface
17 processing liquid dispense port
20 insertion recess 38 space
42 upper surface chemical liquid supply mechanism
43 upper surface rinsing liquid supply mechanism
54 lower surface chemical liquid supply mechanism
55 lower surface rinsing liquid supply mechanism
69 controlling device
71 substrate processing apparatus
72 lower surface nozzle up and down mechanism
81 first substrate opposed plate
82 first substrate opposed plate
82a first substrate opposed surface
83 first substrate opposed plate
83a first substrate opposed surface
W substrate
ω1 to ω5 rotation speed

What is claimed is:

1. A substrate processing method, including:
a substrate rotating step of rotating a substrate around a predetermined vertical axis line at a first rotation speed;
a liquid-tight step which is performed along with the substrate rotating step, and where a first opposed surface is opposed at a predetermined first distance to a lower surface of the substrate being rotated, and at the same time, a processing liquid is discharged from a processing liquid dispense port of a lower surface nozzle opposed to the lower surface of the substrate to cause a space between the lower surface of the substrate and the first opposed surface to be in a liquid-tight state by the processing liquid;
a liquid-tight state releasing step of releasing the liquid-tight state in the space between the lower surface of the substrate and the first opposed surface by separating the lower surface of the substrate and the first opposed surface after the liquid-tight step; and
further including a high-speed rotation treatment step which is performed before the liquid-tight step, and where the processing liquid is supplied to the lower surface of the substrate and where the first opposed surface is opposed to the lower surface of the substrate at a third distance which is larger than the first distance while the substrate is rotated at a second rotation speed higher than the first rotation speed,
wherein performance of the liquid-tight step is started continuously from a conclusion of the high-speed rotation treatment step.

2. The substrate processing method according to claim 1, wherein the first opposed surface has a disk shape, and has an outer peripheral end which is positioned outside of a substrate peripheral end on the lower surface of the substrate.

3. The substrate processing method according to claim 1, wherein in the liquid-tight step, the first opposed surface and a second opposed surface of the lower surface nozzle having the processing liquid dispense port are arranged on the same plane.

4. The substrate processing method according to claim 1, wherein the liquid-tight step comprises
a liquid column forming step of forming a liquid column between the first opposed surface and the lower surface of the substrate by discharging the processing liquid from the processing liquid dispense port in a state where the lower surface nozzle is opposed to a vicinity of a center of the lower surface of the substrate, and
a liquid column expanding step of expanding the liquid column in a circumferential direction of the substrate by further discharging the processing liquid to the liquid column formed in the liquid column forming step.

5. The substrate processing method according to claim 1, further including an upper surface treating step of treating an upper surface of the substrate with the processing liquid by supplying the processing liquid to the upper surface of the substrate,
wherein the liquid-tight step is performed along with the upper surface treating step.

6. The substrate processing method according to claim 1, wherein a flow rate of the processing liquid supplied to the substrate is decreased at a timing of a shift from the high-speed rotation treatment step to the liquid-tight step.

7. The substrate processing method according to claim 6, further including a cleaning step which is performed before the liquid-tight step, and where the first opposed surface is opposed to the lower surface of the substrate at a second distance which is larger than the first distance, the substrate is rotated at a third rotation speed which is faster than the first rotation speed and slower than the second rotation speed, and at the same time, a cleaning liquid is supplied from the processing liquid dispense port to the space between the lower surface of the substrate and the first opposed surface to clean the first opposed surface.

8. The substrate processing method according to claim 7, wherein the cleaning liquid includes the processing liquid, and
the performance of the liquid-tight step is started continuously from a conclusion of the cleaning step, and the liquid-tight step decreases the flow rate of the processing liquid supplied to the substrate from previous one in a manner synchronized with a shift from the cleaning step to the liquid-tight step.

9. The substrate processing method according to claim 1, wherein the processing liquid is an etchant.

* * * * *